United States Patent [19]

Fukushima et al.

[11] Patent Number: 5,396,311
[45] Date of Patent: Mar. 7, 1995

[54] FILTER FOR PROJECTION PHOTOLITHOGRAPHIC SYSTEM

[75] Inventors: Takashi Fukushima, Shiki; Takashi Sugihara, Nara; Junkou Takagi, Kashihara, all of Japan

[73] Assignee: Sharp Kabushiki Kaisha, Osaka, Japan

[21] Appl. No.: 118,812

[22] Filed: Sep. 10, 1993

[30] Foreign Application Priority Data

Sep. 18, 1992 [JP] Japan ................................. 4-249814
Mar. 25, 1993 [JP] Japan ................................. 5-66484
Sep. 2, 1993 [JP] Japan ................................. 5-218790

[51] Int. Cl.⁶ ...................... G03B 27/72; G03B 27/42; G03B 27/32
[52] U.S. Cl. .................................... 355/71; 355/53; 355/77
[58] Field of Search ........................... 355/53, 71, 77

[56] References Cited

U.S. PATENT DOCUMENTS

| | | | |
|---|---|---|---|
| 4,631,416 | 12/1986 | Trutna, Jr. | 250/548 |
| 4,931,830 | 6/1990 | Suwa et al. | 355/71 |
| 5,025,165 | 6/1991 | Chen et al. | 250/491.1 |
| 5,144,362 | 9/1992 | Kamon et al. | 355/53 |
| 5,208,629 | 5/1993 | Matsuo et al. | 355/53 |
| 5,253,040 | 10/1993 | Kamon et al. | 356/399 |
| 5,264,898 | 11/1993 | Kamon et al. | 355/67 |
| 5,274,420 | 12/1993 | Chastang et al. | 355/67 |
| 5,311,249 | 5/1994 | Kamon et al. | 355/71 |

OTHER PUBLICATIONS

Tounai et al, "Resolution Improvement with Annular Illumination", SPIE vol. 1674 Optical/Laser Microlithography V (1992), pp. 753–766.

Kamon et al, "Photolithography System Using Annular Illumination", JJAP Series 5, Proc. of 1991 Intern. MicroProcess Conference, pp. 33–41.

Shiraishi et al, "New Imaging Technique for 64M–DRAM", SPIE vol. 1674 Optical/Laser Microlithography V (1992), pp. 741–753.

Noguchi et al, "Subhalf Micron Lithography System With Phase–Shifting Effect", SPIE vol. 1674 Optical/Laser Microlithography V (1992), pp. 92–105.

Primary Examiner—Richard A. Wintercorn
Attorney, Agent, or Firm—Nixon & Vanderhye

[57] ABSTRACT

A filter for use in a projection photolithographic system comprising:

a circular light-impervious part for screening substantially 100% on the pupil of a projection lens the 0th-order diffracted light of a pattern to be projected on a substrate;

a ring-like translucent part concentrically contacting the periphery of the circular light-impervious part to transmit on the pupil part of the 0th-order diffracted light and the +1st- or the −1st-order diffracted light of the pattern; and a ring-like light-pervious part concentrically contacting the periphery of the ring-like translucent part to transmit substantially 100% on the pupil the ±1st-order diffracted light of the pattern.

11 Claims, 23 Drawing Sheets

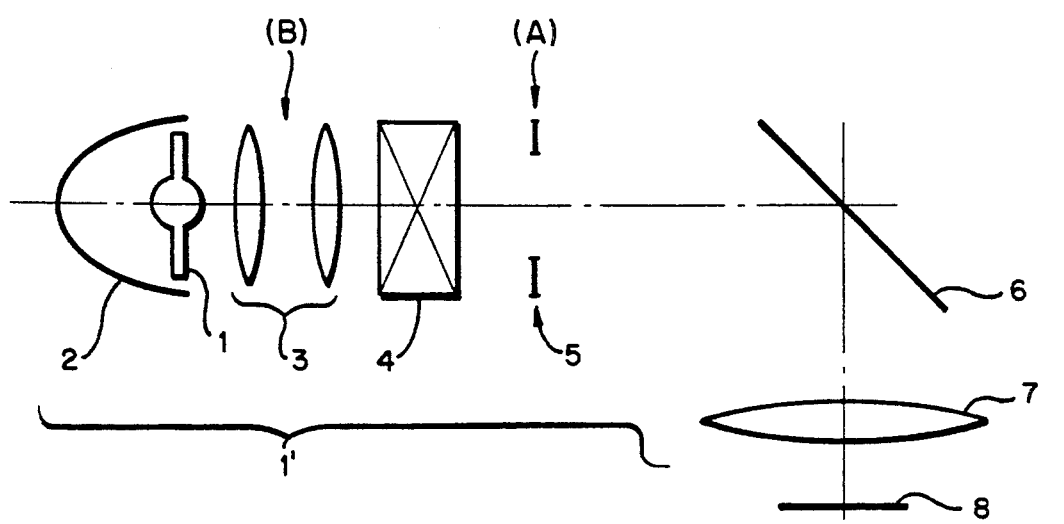
*FIG. 1a*
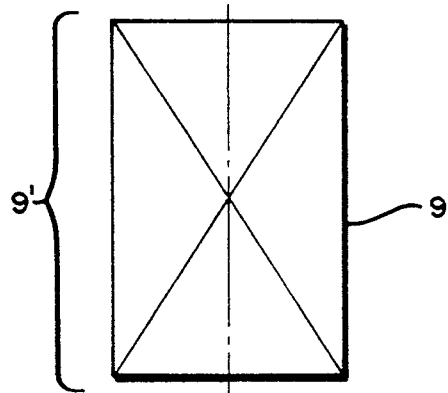
*FIG. 1b*
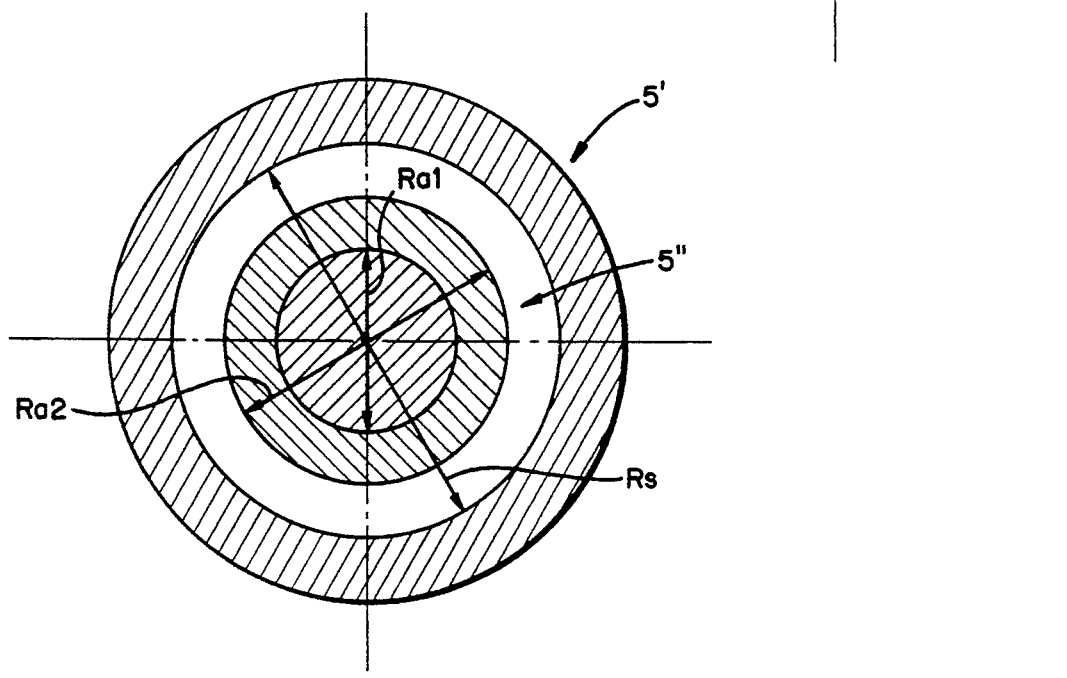

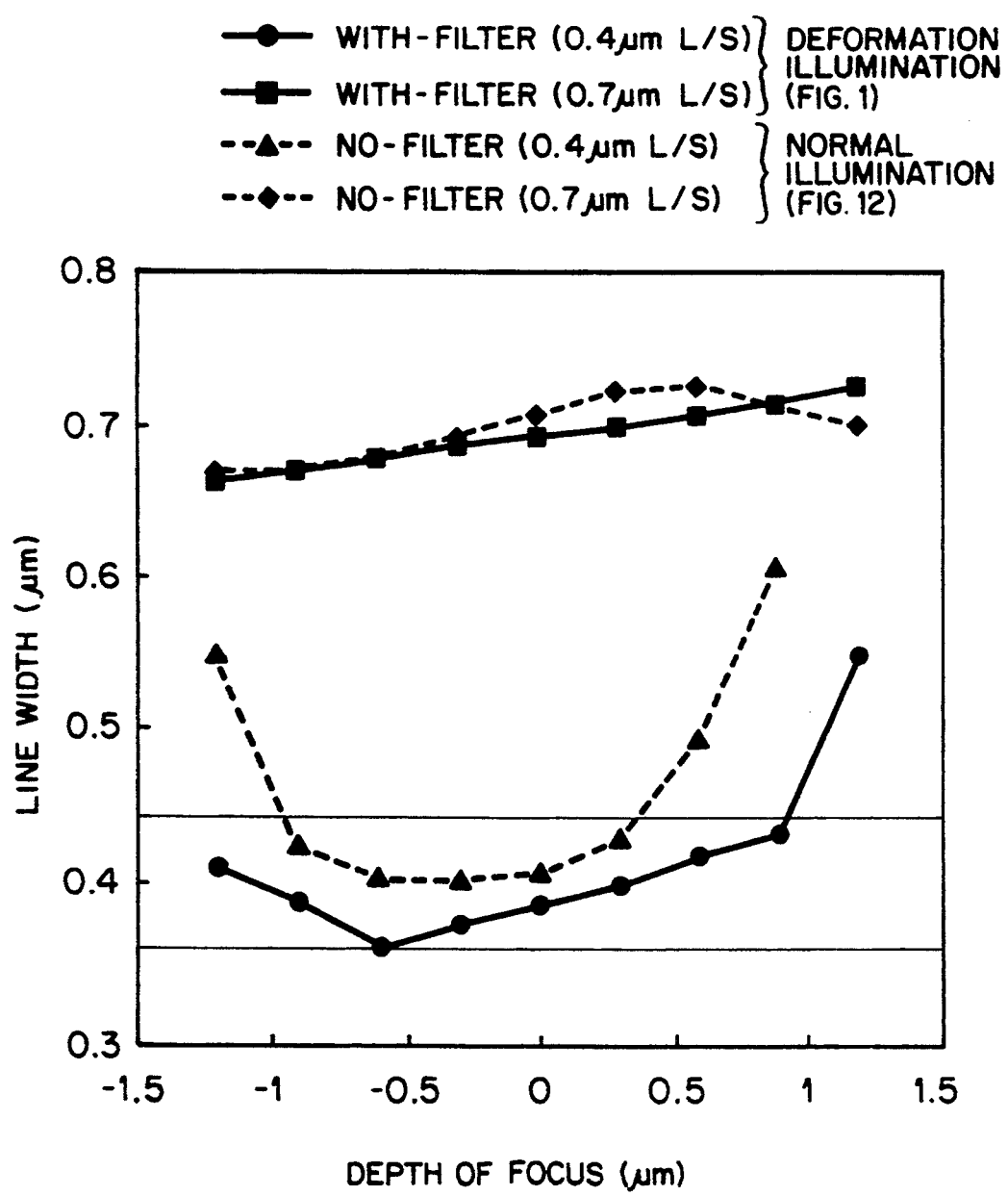

TRANSMITTANCE RATE MODULATION TYPE IMPROVEMENT OF RESOLUTION USING DEFORMATION ILLUMINATION TECHNIQUE

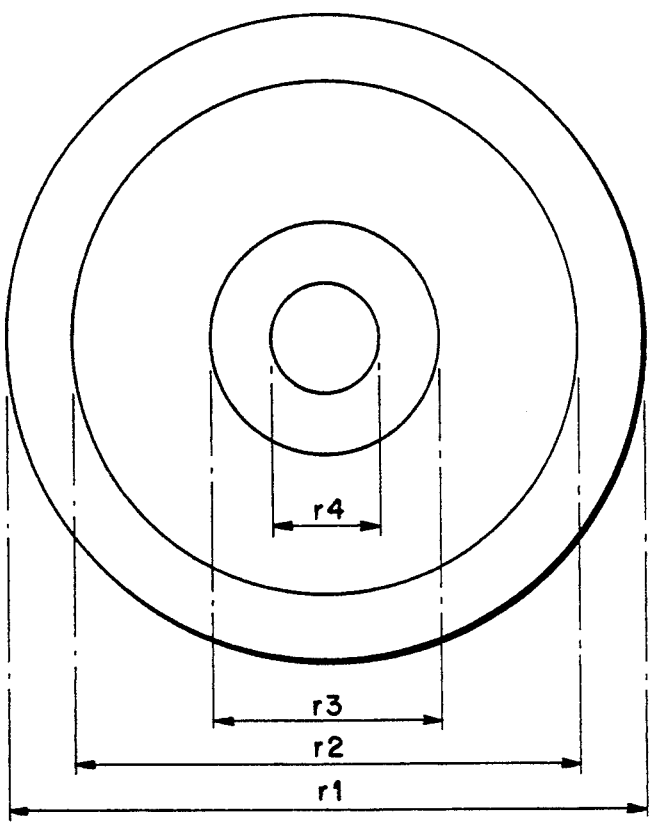
FIG. 21a
FIG. 21b
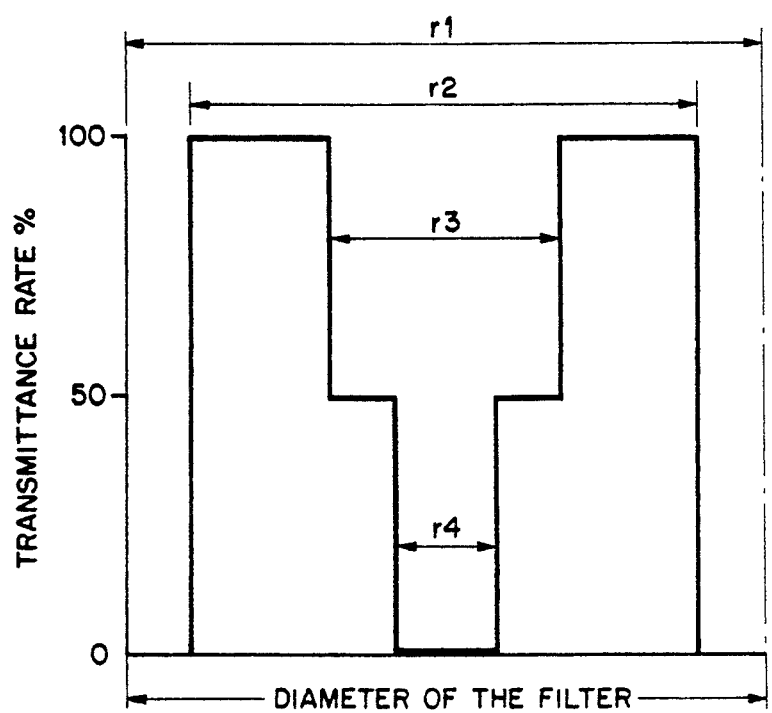

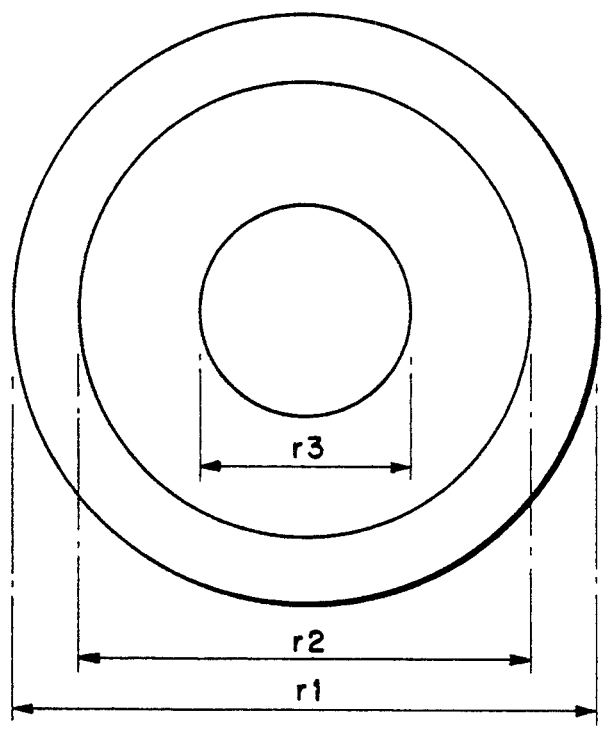
FIG. 26a
FIG. 26b
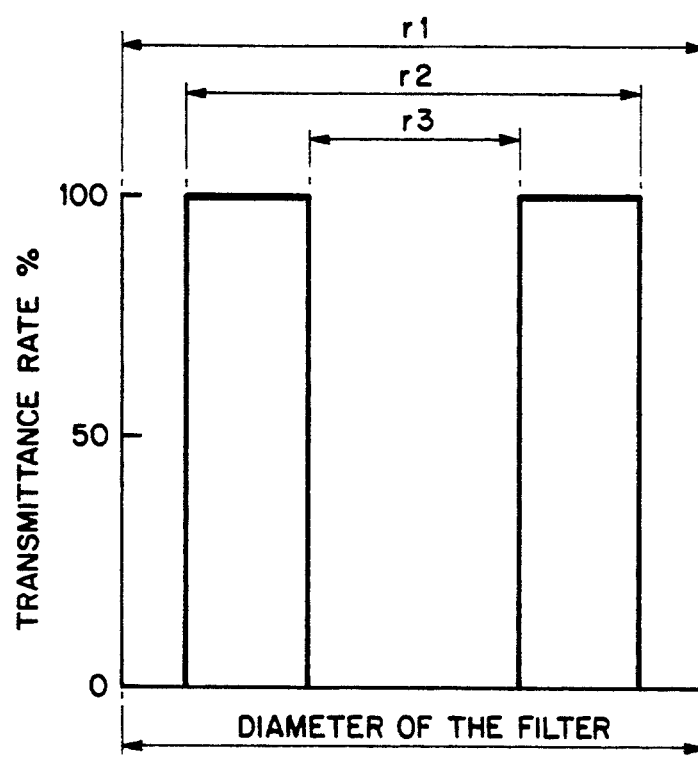

FILTER FOR PROJECTION PHOTOLITHOGRAPHIC SYSTEM

BACKGROUND OF THE INVENTION

1. Field of the Invention

The present invention relates to filters for use in projection photolithographic system, and more particularly to a filter for use in a photolithographic system used in manufacturing a semiconductor device, or a photolithographic system which uses either a visible light or a ultraviolet light to project or transcribe a pattern on a mask for the photolithographic process.

2. Description of the Prior Art

On silicon substrates of very large scale integration (LSI) semiconductor devices manufactured in recent years, a plurality of transistors and wirings on the submicron order are integrated. For forming these fine patterns is used the photolithographic technique in which mask patterns are demagnified (usually to the size of one fifth of the original) and transcribed on a photosensitive (resist) resin films coating semiconductor substrates to form patterns on the submicron order.

Semiconductor memory devices such as 1M DRAM's and 4M DRAM's currently manufactured in large quantity use a minimum line width of 1.2 μm and 0.8 μm. Most of photolithographic systems used for manufacturing such semiconductor devices use luminous rays such as g-line having a wavelength of 436 nm and emitted from ultra-high pressure Hg lamps. Some of the photolithographic systems have just begun to use luminous rays such as i-line having a wavelength of 365 nm.

Semiconductor memory devices such as 16M DRAM's and 64M DRAM's to be manufactured in the future are expected to have a minimum line width of 0.6 to 0.5 μm or 0.4 to 0.3 μm. Manufacturing such semiconductor devices in large quantity requires the development of photolithographic technique having a higher resolution. For improving the resolution by shortening the wavelength of photolithographic light, use of i-line in the place of g-line, and even use of Krypton-fluorine (KrF) excimer laser are currently studied.

These new photolithographic systems illuminate the rear surface of masks on which are arranged opaque patterns normally formed of sheet metal on transparent substrates like quartz and demagnify a luminous flux passing through the masks thereby forming an image on semiconductor substrates.

FIGS. 12a and 12b shows one example schematically illustrating a photolithographic system currently used in the process for manufacturing semiconductor devices.

Reference Numeral 1 designates a Hg lamp used as a light source. Light passing through the photolithographic system is rendered parallel by an oblong mirror 2, a lens system 3, and a fly's-eye lens 4. Then a circular aperture 5 limits to a definite area the region transmitting light (such region is circular as shown by 5b in the front view of FIG. 12a). Light reflected at a reflection mirror 6 passes through an illumination lens 7 and then illuminates a photolithographic mask 8 (these systems are generally referred to as illumination optical system 1a). Patterns formed on the photolithographic mask 8 are demagnified to one fifth of the original by a projection lens 9 to be transcribed on a semiconductor substrate 10.

Such projection photolithographic system forms an image by allowing the 0th-order diffracted light and the +1st- or the −1st-order diffracted light to strike the projection lens. It is well known that such process establishes the following equation (1) between the dimension (D) of the mask pattern that can be resoluted, the numerical aperture (NA) of the projection lens and the wavelength of exposure light;

$$D = k \cdot \lambda / NA \qquad (1)$$

where k is a constant called a process constant.

Thus conventional methods for transcribing fine patterns include such measures as either shortening the wavelength of photolithographic light or enlarging the NA of the projection lens. Out of the two measures, enlarging the NA of the projection lens is not considered to be an appropriate method since the depth of focus (DOF) reduces at a rate inversely proportional to the NA squared as shown in equation 2.

$$DOF = f \cdot \lambda / NA^2 \qquad (2)$$

where f is a constant called a process constant.

Thus, photolithographic systems usually used in manufacturing semiconductor device finds it very difficult to make a remarkable improvement in resolution without reducing the DOF. Consequently a demand has been made for a simple method for improving the resolution without deteriorating the DOF.

As a method for improving the resolution and the DOF in the above projection photolithographic system, a phase shift mask is proposed in recent years. However, the phase shift mask has a drawback of complicated process for preparing a mask and a complicated mask design despite a large improvement made in the resolution and the DOF.

Further proposed as a method for the same purpose is the annular illumination process in which the central part of the illumination filter (σ aperture) is screened from light to allow the light to strike slantwise a mask (see "Photolithography System Using Annular Illumination" carried on Proc. of 1991 Intern. MicroProcess Conference published in July, 1991). This method permit the use of the conventional mask without making any improvement or modification and is still capable of improving both the resolution and the DOF. However, the annular illumination process screens a relatively large area of the central part of the filter (σ aperture) completely from light, thereby generating a large energy loss of the photolithographic light (lowered through-put).

Still further proposed as a method for improving the resolution and the DOF is the four point incident illumination process in which the illumination filter (σ aperture) is changed or an illumination system itself is modified (see Japanese Laid-Open Patent No. HEI 4 (1992)-101148). This four point incident illumination process has an advantage that the conventional mask can be used without making any improvement or modification like the annular illumination process and that a larger improvement can be made in resolution and the DOF than the annular illumination process. However, the process depends largely on the mask pattern simply because the process uses the four point illumination. In extreme cases, the resolution and the DOF are deteriorated compared with ordinary illumination systems. Besides, the four point illumination process has a drawback of a large energy loss of the photolithographic light (lowered through-put).

As mentioned above, photolithographic systems normally used can hardly make a conspicuous improvement in the resolution without deteriorating the DOF. Conventionally processes such as a phase shift mask, the annular illumination process and four points illumination process have been proposed as a method for improving the resolution and the DOF but such processes have some defects. Thus demand has been made for a simple method for improving the resolution and the depth of width free from large energy loss of exposure light and dependency on patterns.

SUMMARY OF THE INVENTION

The present invention provides a filter for use in a projection photolithographic system comprising:
  a circular light-impervious part for screening substantially 100% on the pupil of a projection lens the 0th-order diffracted light of a pattern to be projected on a substrate of the projection photolithographic system;
  a ring-like translucent part concentrically contacting the periphery of the circular light-impervious part to transmit on the pupil of the projection lens part of the 0th-order and the +1st- or the −1st-order diffracted light of the pattern to be projected on the substrate; and
  a ring-like light-pervious part concentrically contacting the periphery of the ring-like translucent part to transmit substantially 100% on the pupil of the projection lens the +1st- or the −1st-order diffracted light of the pattern to be projected on the substrate.

Therefore, the present invention adjust two contradictory demands of securing the effect of slanted illumination light incident to the mask and of securing a sufficient energy of the photolithographic light by forming
  a circular light-impervious part for screening substantially 100% on the pupil of a projection lens the 0th-order diffracted light of a pattern to be projected on a substrate of the projection photolithographic system;
  a ring-like translucent part concentrically contacting the periphery of the circular light-impervious part to transmit on the pupil of the projection lens part of the 0th-order diffracted light and the +1st- or the −1st-order diffracted light of the pattern to be projected on the substrate; and
  a ring-like light-pervious part concentrically contacting the periphery of the ring-like translucent part to transmit substantially 100% on the pupil of the projection lens the +1st- or −1st-order diffracted light of the pattern to be projected on the substrate thereby improving the resolution with ease without deteriorating the DOF.

In accordance with the present invention, the ring-like translucent part is constituted for compensating the energy of the photolithographic light by transmitting on the pupil of the projection lens part of the 0th-order diffracted light and the +1st- and the −1st-order diffracted light on the pupil of the pattern to be projected on the substrate. Preferably, the sum total of the transmittance rate of the photolithographic light ranges 5 to 30% in concrete terms. Here the sum total of the transmittance rate means the sum total of the transmittance rate of the diffracted light such as part of the 0th-order diffraction light and the +1st- or the −1st-order diffraction light of the pattern to be projected on the substrate.

In accordance with the present invention, the circular light-impervious part was constituted for screening substantially 100% (preventing the transmission of) part of the 0th-order diffracted light and any of ±1st-order diffracted lights whereas the ring-like light-pervious part is constituted to transmit substantially 100% on the pupil of the projection lens the +1st- or the −1st-order diffracted light of the pattern to be projected on the substrate.

The size of the regions occupied by the ring-like translucent part, the circular light-impervious part, and the ring-like light-pervious part are constituted respectively in the following manner. Preferably the outer diameter of the circular light-impervious part is set to 0.05 to 0.50, or more preferably 0.10 to 0.20 of the outer diameter of the ring-like light-pervious part. Preferably the outer diameter of the ring-like translucent part is set to 0.65 to 0.75, or more preferably 0.67 to 0.72 of the outer diameter of the ring-like light-pervious part.

In accordance with the present invention, the ring-like translucent part can be constituted by any of the following method:
  (a) making approximately uniform the sum total of the transmittance rate of diffracted light such as part of the 0th-order diffracted light and the +1st- or the −1st-order diffracted light of the pattern to be projected on the substrate on the pupil of the projection lens;
  b) changing the sum total transmittance rate thereof in a stepwise manner; or
  c) gradually changing the sum total transmittance rate thereof.

In case a) the ring-like translucent part comprises concretely a group of light-impervious fine lines comprising a plurality of fine line concretely formed with an equal width or in an equally spaced manner and a group of light-pervious fine lines formed between (in a spacing of) each of the light-impervious fine lines, the light-impervious fine lines screening the 0th-order diffracted light substantially to 0% level, the light-pervious fine lines transmitting substantially 100% on the pupil of the projection lens the 0th-order diffraction light. In this particular case, the width (see Symbol a in FIG. 8 (b)) and the space (see Symbol b in FIG. 8 (b)) of light-impervious fine lines are not particularly specified. In forming such fine lines with the known semiconductor manufacturing process, preferably the width of fines lines is set to about 4 to 50 $\mu$m and the space therebetween to about 4 to 50 $\mu$m.

Otherwise, the ring-like translucent part comprises a group of light-impervious fine lines formed by intersecting a plurality of equally spaced fine lines with equal width and a group of light-pervious dots formed between (in a space of) each light-impervious fine lines, the light-impervious fine lines screening the 0th-order diffracted light substantially to 0% level, the light-pervious fine dots transmitting substantially 100% on the pupil of the projection lens the 0th-order diffraction light. In this particular case, the width (see Symbol a in FIG. 8 (a)) and the space (see Symbol b in FIG. 8 (a)) of light-impervious fine lines are not particularly specified. In forming such fine lines with the known semiconductor manufacturing process, preferably the width of fines lines is set to about 4 to 50 $\mu$m and the space therebetween to about 4 to 50 $\mu$m.

Otherwise, the ring-like translucent part can be constituted by scattering and forming uniformly a plurality of light-impervious dots having the same shape (the shape is not particularly specified, but it can assume such shapes as circle or square).

Otherwise, the ring-like translucent part can be formed of translucent film having an uniform transmittance rate. The translucent film can be formed of, for example, a spin-on glass mixed with pigment. Appropriate selection of the kind and concentration of pigment enables setting the transmittance rate to a desired value. Any pigment or dye that can be dissolved or scattered in spin-on glass can be used, but MBT-112 and MBP-112 manufactured by Mitsui Toatsu Dyes are given as preferable material.

Otherwise silicon nitrogen oxide film can be used as a translucent film. The transmittance rate thereof can be set to a predetermined value by an appropriately selected quantity of oxygen.

In case b), the ring-like translucent part can be constituted of two or three contacting ring-like portions having different transmittance rate. For example, the ring-like translucent part can be constituted of a first translucent part concentrically contacting the periphery of a circular light-impervious portion and a ring-like second translucent portion concentrically contacting the periphery of the first translucent portion. The first translucent portion sets to 5% or more on the pupil of the projection lens the sum total of the transmittance rate of the diffracted light such as part of the 0th-order diffracted light and the +1st- or the −1st-order diffracted light of the pattern to be projected on the substrate. The second translucent part sets to more than the counterpart of the first translucent part but not more than 30% on the pupil of the projection lens the sum total of the transmittance rate of the diffracted light such as part of the 0th-order diffracted light and the +1st- or the −1st-order diffracted light of the pattern to be projected on the substrate.

The filter provided by the present invention can be mounted on the known projection photolithographic system. Thus, in the projection photolithographic system having an illumination optical system for illuminating a mask on which fine patterns are formed with a visible light or a ultraviolet light used as a light source, the filter of the present invention can be appropriately mounted on at least one of the pupil of the illumination optical device or a position cooperating with the pupil thereof. As a consequence, fine patterns formed on the mask can be demagnified and projected on the substrate without deteriorating the DOF. Referring to FIGS. 1a and 1b the position where the filter of the present invention can be mounted will be explained hereinbelow. Symbol (A) designates the position where the pupil of the illumination optical system can be set whereas (B) designates generally the position cooperating with the pupil.

The principle of demagnifying and projecting fine patterns formed on the mask with high resolution without deteriorating the DOF by mounting the filter of the present invention on the illumination device of the projection photolithographic system by way of FIGS. 15a–15d (for simplicity, only photolithographic light passing through the center of the optical axis is used in illustrating the principle). FIG. 15 (a) is a view of a simple model showing the image forming process in a projection photolithographic system having an illumination optical device. A photolithographic light 1 passing through a $\sigma$ aperture 2 is diffracted by fine patterns on a mask to generate the 0th-order, the +1st order and the −1st-order diffracted light each designated by symbols P0, +P1 and −P1. (Furthermore, higher order diffracted light such as more than the ±2nd-order diffracted lights are produced, but they are not considered here because they are so weak that they do not contribute toward the image forming process). These three kinds of diffracted light forms an image on a substrate 5 by striking a pupil 4 of a projection lens. At this time, the diffraction angle of the ±1st diffraction light $\theta a$ is represented by the following equation when the pitch of fine patterns formed on the mask is designated by P and the wavelength of the photolithographic light is designated by $\lambda$;

$$\theta a = \operatorname{Sin}^{-1}(2m\lambda/P) \text{ (where m designates the order of diffraction)} \quad (3)$$

As apparent from the above equation (3), the diffraction angle $\theta a$ enlarges with reducing pitch P of fine patterns formed on the mask 3. When the pitch P formed on the mask 3 reduces to less than a certain size, the ±1st-order diffracted lights +P1 and −P1 do not strike the pupil 4 of the projection lens with the result that fine patterns formed on the mask 3 fail to form an image on the substrate 5. On the other hand, when the photolithographic light is directed slantwise to the mask 3 by concentrically screening the central part of the $\sigma$ aperture of the illumination optical system or providing a four point illumination as shown in (c), the light is diffracted by fine patterns formed on the mask 3 as shown in FIG. 15 (a) and FIG. 15 (b). The diffraction angle $\theta c$ is determined in accordance with the equation (3). At this time either +1st or the −1st-order diffraction light (+1st-order diffraction light in the embodiment shown in FIGS. 15a–15d) as well as the 0th-order diffraction light strike the pupil 4 of the projection lens to form an image on the substrate 5. Thus concentrically screening the central part of the $\sigma$ aperture 2 or providing a four point illumination to allow the photolithographic light to strike slantwise the mask 3 reduces to one half the effective diffraction angle $\theta c'$ of the photolithographic light incident on the pupil 4 of the projection lens. Consequently, it becomes possible theoretically to improve by twice the resolution of the projection photolithographic system. However, concentrically screening the central part of the $\sigma$ aperture or providing a four point illumination relatively reduces the energy of the photolithographic light incident on the substrate 5 per unit time compared with ordinary illumination (For example screening 0.7 portion relative to the diameter of the light-pervious part reduces to about one half the energy of the effective photolithographic light that reaches the substrate 5), thereby generating a lowered throughput. In accordance with the present invention, as shown in FIG. 15 (d) the filter 2 is used which comprises a circular light-impervious part that screens 100% the illumination light, a ring-like translucent par concentrically contacting the periphery of the light-impervious part to partly transmit the diffracted light of the illumination light and a light-pervious part contacting the periphery of the light translucent part to transmit substantially 100% the illumination light. Consequently, it is possible to increase the energy of the effective energy of the photolithographic light that can reach the substrate 5 without deteriorating the image forming properties in the same manner as shown in FIG. 15 (c) by directing slantwise to the substrate 5 the photolithographic light like light shown by 1 in FIG. 15 (c) and by directing slantwise to the mask 3 a small quantity of the photolithographic light at a further smaller incident angle like light shown by 1' in FIG. 15 (c).

From a different viewpoint, the present invention provides a method for manufacturing a filter comprising the steps of:

forming a light screening thin film on a substrate pervious to a visible light or a ultraviolet light, the thin film screening the visible light and the ultraviolet light;

applying on the light screening thin film a resist film for drawing patterns with electron beams;

drawing a desired pattern on the resist film with electron beams followed by developing the resist film to etch the light screening thin film by using as a mask the remaining resist film corresponding to the circular light-impervious part and the group of light-impervious fine lines in the ring light translucent part; and separating the remaining resist film.

From still different viewpoint, the present invention provides a method for manufacturing a filter comprising the steps of:

forming a light-screening thin film on a substrate pervious to a visible light and a ultraviolet light, the thin film screening the visible light and the ultraviolet light;

applying on the light-screening thin film a first resist film for drawing patterns with electron beams;

drawing a desired pattern with electron beams on the first resist film followed by developing the first resist film to etch the light-screening thin film by using as a mask the remaining first resist film corresponding to the circular light-impervious part;

separating the remaining first resist film;

forming on the substrate including a remaining light-screening thin film a translucent thin film that lowers to 5 to 30% relative to the wavelength of the photolithographic light the sum total of the transmittance rate of part of 0th diffracted light and the +1st- or the −1st-order diffracted light, applying on the translucent thin film a second resist film for drawing patterns with electron beams;

drawing a desired pattern with electron beams on the second resist film followed by developing the second resist film to etch the translucent film by using as a mask the remaining second resist film corresponding to the ring-like translucent part; and separating the resist film.

BRIEF DESCRIPTION OF THE DRAWINGS

The present invention will become fully understood from the detailed description given hereinbelow and accompanying drawings which are given by way of illustration only and thus are not limitative of the present invention in which:

FIGS. 1a and 1b are a view for generally illustrating a projection photolithographic system attached with a filter for the projection photolithographic system in accordance with the present invention;

FIG. 13 is a graph showing an improvement in the focus of the filter in Embodiment 2;

FIGS. 21a–21b are plane views showing a configuration of a deformation aperture in Embodiment 4;

FIGS. 22a–21b are plane views showing a configuration of a lattice-like translucent region in Embodiment 4;

FIGS. 26a–26b are views showing a configuration of an annular illumination aperture to be compared with the present invention.

DETAILED DESCRIPTION OF THE PREFERRED EMBODIMENT

The present invention will be detailed in conjunction with preferred embodiments but the invention is not limited by them.

Embodiment 1

Figure 2A:
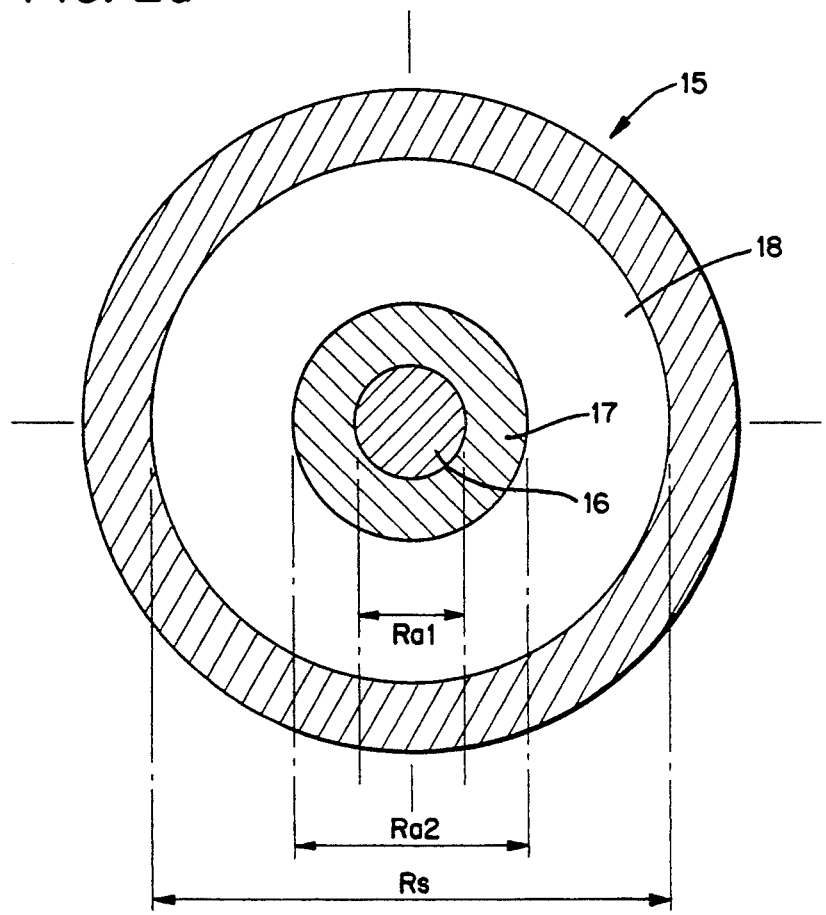
FIGS. 2a and 2b are for illustrating a filter of the present invention.
Figure 2B:
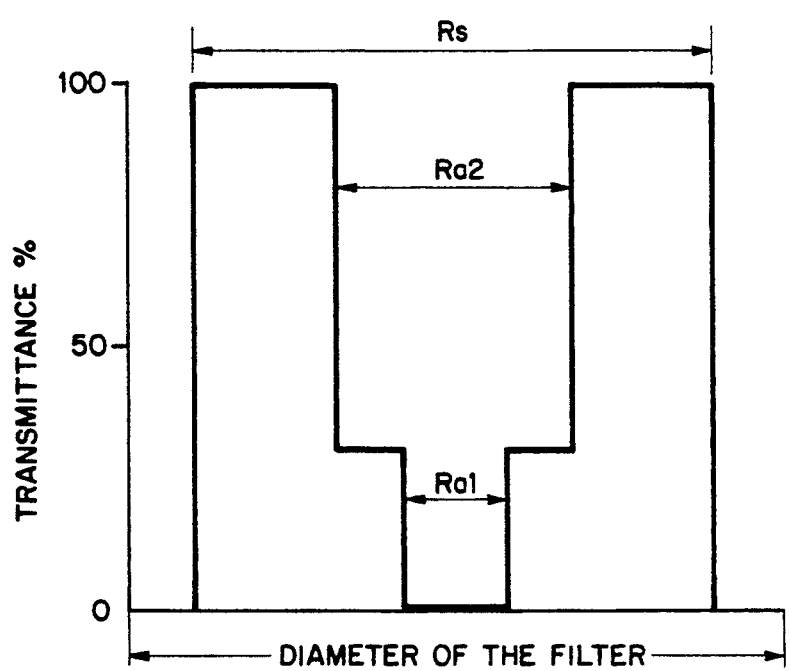
Figure 3:
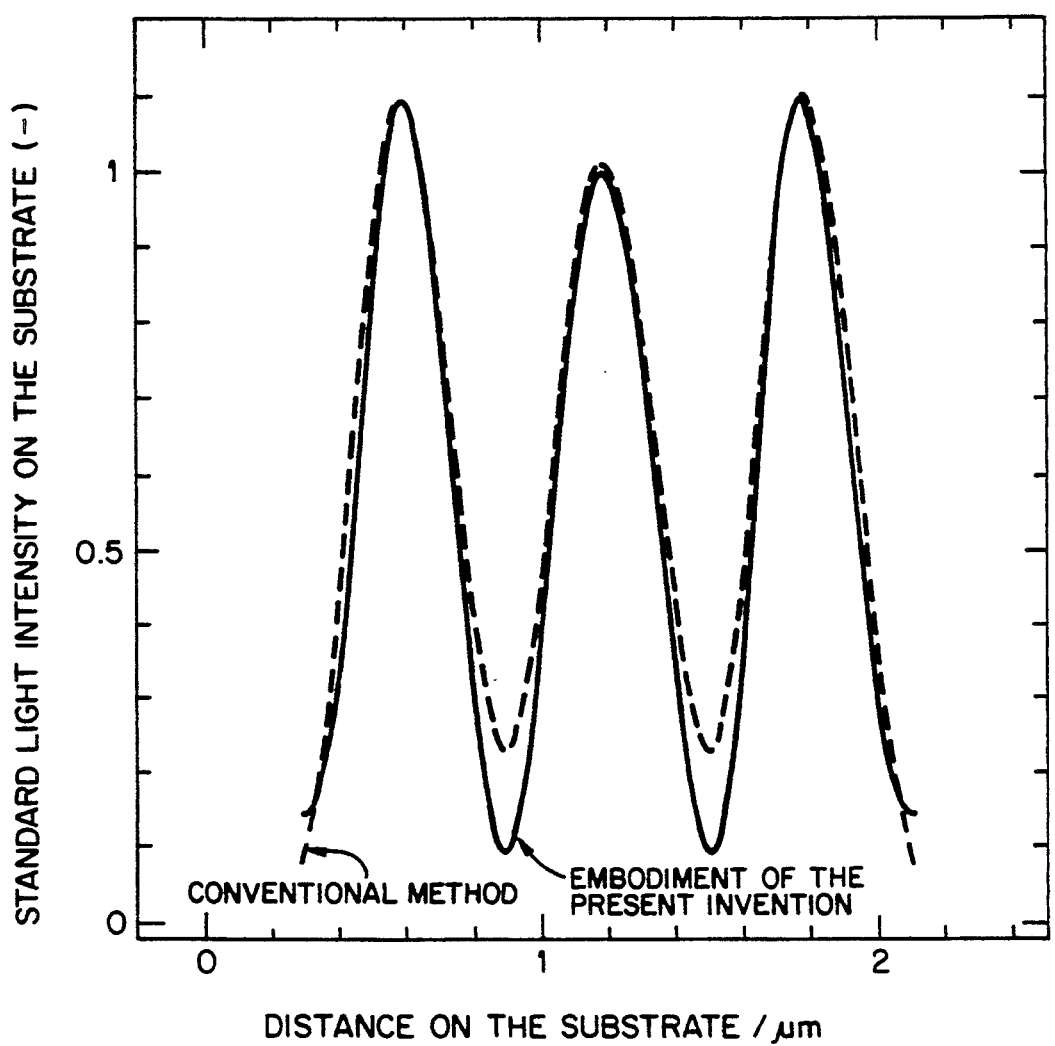
FIG. 3 is a graph showing a result of a simulated comparison between a conventional projection type photolithographic system and the photolithographic system of the present invention.
Figure 5:
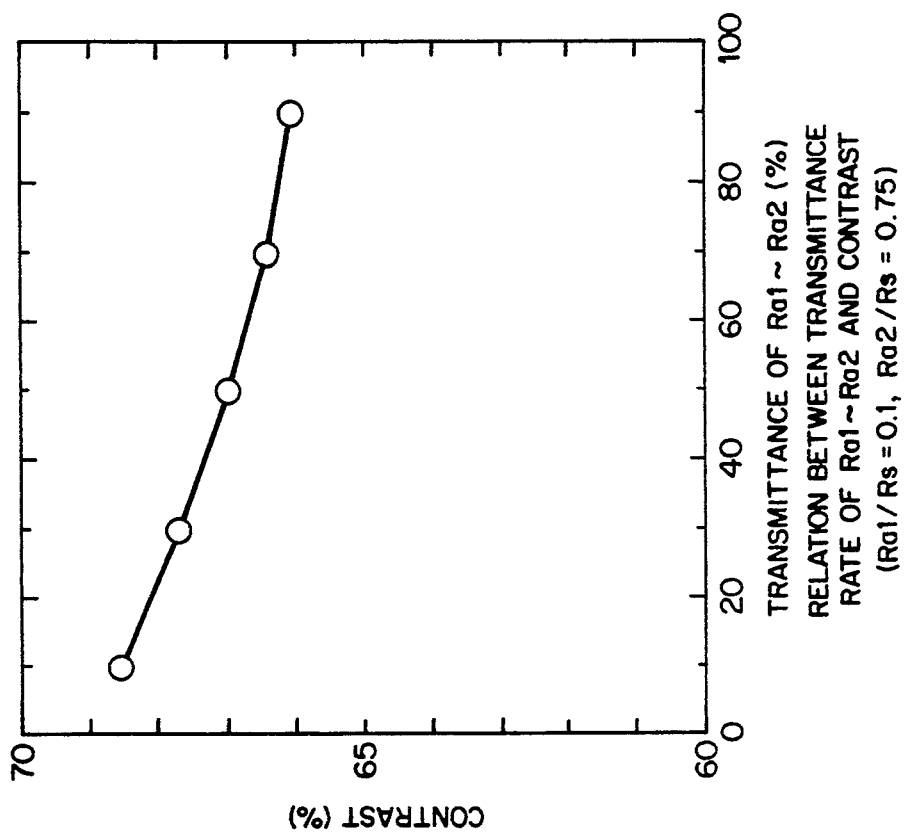
FIG. 5 is a graph showing a simulation result of a filter light transmittance rate to contrast relation.

Embodiment 1 of the present invention will be detailed according to FIGS. 1a–1b. FIGS. 1a–1b which are general views of a projection photolithographic system. The construction thereof is almost the same as the conventional projection photolithographic system. Reference Numeral 1 designates a Hg lamp used as a light source. Light passing through the photolithographic system is rendered parallel by an oblong mirror 2, a lens system 3, and a fly's-eye lens 4. Then a circular aperture 5 (front view 5') limits to a definite area the region transmitting light. Light reflected at a reflection mirror 6 passes through an illumination lens 7 and then illuminates a photolithographic mask 18 (these systems are generally referred to as illumination optical system 1'). Patterns formed on the photolithographic mask 18 is demagnified to one fifth of the original by a projection lens 9 to be transcribed on a semiconductor substrate 10. As shown in FIGS. 2a-2b as a concrete example of an aperture 5 is given a filter (15) having a transmittance rate of 10% in the range of Ra 1 under the condition of Rs of 60 mm, Ra1 of 12 mm, and Ra2 of 40 m. The filter (15) was used as a concrete example of aperture 5 to perform a simulation operation. As shown in FIG. 3, the operation confirms that the contrast has improved as compared with conventional methods. Incidentally, Reference Numeral (16) in FIGS. 2a-2b designate a circular light-impervious part, (17) a ring-like translucent part, and (18) a ring-like light-pervious part.

The above filter is mounted on the pupil of the illumination optical device. Then a photolithographic test was performed with an i-line stepper having a numerical aperture (NA) of 0.45. Conventionally the resolution was limited to a line and space of 0.4 μm. Use of the above filter according to the present invention allows resoluting an image to a line and space of 0.32 μm. Thus a 20% improvement in the resolution was confirmed.

As a deformation the filter according to the present invention, the sizes of Rs, Ra1 and Ra2 are not limited as shown in FIGS. 2a-2b. Needless to say, particularly Rs depends largely on the photolithographic system used. Consequently, Rs varies with the photolithographic system used.

Figure 4:
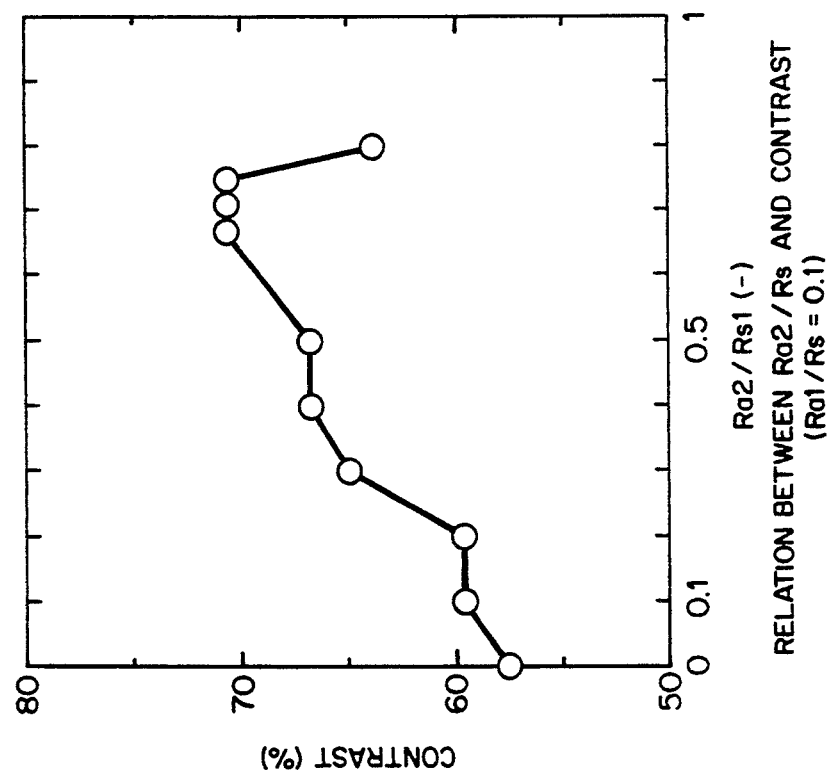
FIG. 4 is a graph showing a simulation result of filter properties.

Besides, Ra1/Rs offers the same effect at a ratio of Ra1/Rs ranging between 0.1 to 0.5 and Ra2/Rs ranging between ⅔ to 0.75 as shown in FIG. 4. However, the entire energy of the photolithographic light incident to the substrate is approximately equal to the product of the exposure time and the intensity of light passing through the filter. As shown in Table 1-1 and Table 1-2, preferably, the sum total or the effective transmittance rate (hereinafter simply referred to as transmittance rate) of the filter is raised at the Ra1/Rs ratio of about 0.1 and the Ra2/Rs ratio of about ⅔.

TABLE 1-1

| Area Ratio in the Transmittance Rate Modulating Portion | | | | | | Effective Transmittance Rate |
|---|---|---|---|---|---|---|
| (Transmittance Rate = 0%) | | (Transmittance Rate = 30%) | | (Transmittance Rate = 100%) | | |
| Ra1/Rs | Area Ratio | Ra2/Rs | Area Ratio | Outermost Periphery | Area Ratio | |
| 0.1 | 0.01 | 2/3 | 0.43 | | 0.56 | 0.689 |
| 0.2 | 0.04 | 2/3 | 0.4 | | 0.56 | 0.68 |
| 0.3 | 0.09 | 2/3 | 0.35 | | 0.56 | 0.665 |
| 0.4 | 0.16 | 2/3 | 0.28 | | 0.56 | 0.664 |
| 0.5 | 0.25 | 2/3 | 0.19 | | 0.56 | 0.617 |

TABLE 1-2

| Area Ratio in the Transmittance Rate Modulating Portion | | | | | | Effective Transmittance Rate |
|---|---|---|---|---|---|---|
| (Transmittance Rate = 0%) | | (Transmittance Rate = 30%) | | (Transmittance Rate = 100%) | | |
| Ra1/Rs | Area Ratio | Ra2/Rs | Area Ratio | Outermost Periphery | Area Ratio | |
| 0.1 | 0.01 | 2/3 | 0.43 | | 0.56 | 0.689 |
| 0.1 | 0.01 | 0.7 | 0.48 | | 0.52 | 0.664 |
| 0.1 | 0.01 | 0.75 | 0.55 | | 0.45 | 0.615 |

Furthermore, the transmittance rate in the range of Ra to Ra2 gives the same effect as long as it ranges between 5 to 30%. Preferably the transmittance rate ranges about 30% from the viewpoint of the throughput. In addition realizing the same effect of resolution and DOF in accordance with the conventional annular illumination method requires equalizing the diameter Ra 1 of the light-screening portion in the central portion of the filter with Ra2/Rs ratio in the above embodiment with respect to Rs. Consequently with respect to the minimum value of Ra2/Rs assuming ⅔, the effective transmittance rate is 0.56. In embodiment 1 shown in Table 1-1, the throughput can be improved by 10 to 23%.

Figure 6A:
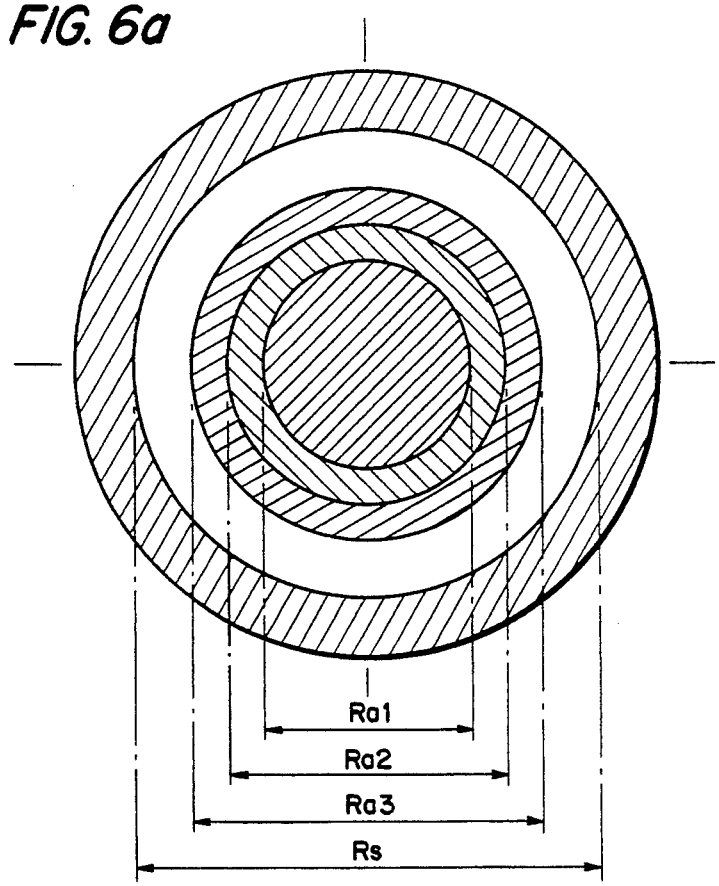
FIGS. 6a–6b are views illustrating the construction of the filter of the present invention.
Figure 6B:
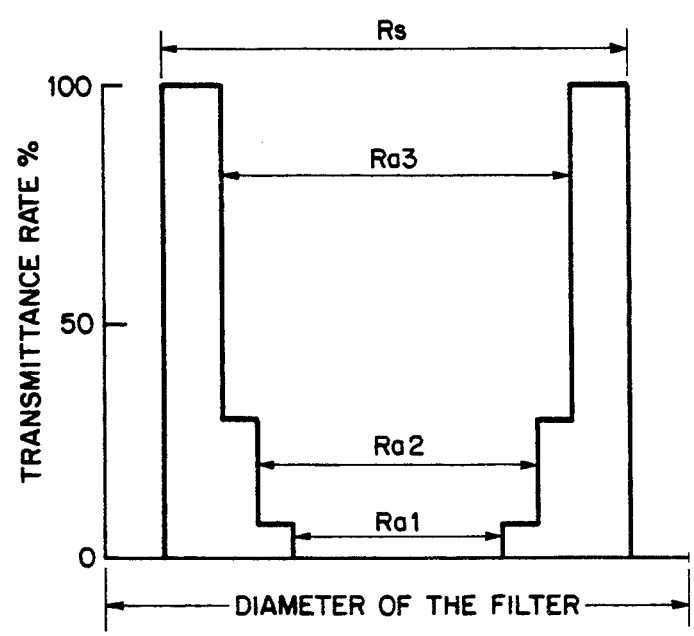

In accordance with the above Embodiment 1, the transmittance rate in the neighborhood of the optical axis is set to 0%, the transmittance rate at the outermost periphery is set to 100%. Then the transmittance rate in the intermediate portion between the two regions is set to 5 to 30%. The transmittance rate is thus varied in two stages so as to improve the resolution and the DOF of the projection photolithographic system. As shown in FIG. 6 changing the transmittance rate in three stages will produce the same effect. In such case, when the diameter which determines σ of the projection photolithographic system is set to Rs, it is necessary to set to 0% the transmittance rate in the range of Ra1 regulated at the Ra1/Rs ratio ranging between 0.1 and 0.3 centering on the optical axis of the photolithographic light. It is also necessary to set to 5 to 10% the transmittance rate in the range of Ra1 regulated at the Ra1/Rs ranging between 0.3 to 0.5 at the outer periphery of the above central part. It is also necessary to set to 10 to 30% the transmittance rate in the range of the diameter Ra 3 regulated at the Ra3/Rs ratio ranging between ⅔ and 0.75.

Incidentally it is apparent that the same effect is produced when such filer is mounted at a position other than the pupil of the illumination device in the projection photolithographic system and the position cooperating with the pupil. In addition, it is also apparent that the resolution and the DOF of such filter can be improved irrespective of the wavelength of the photolithographic light. Embodiment 2

Figure 7A:
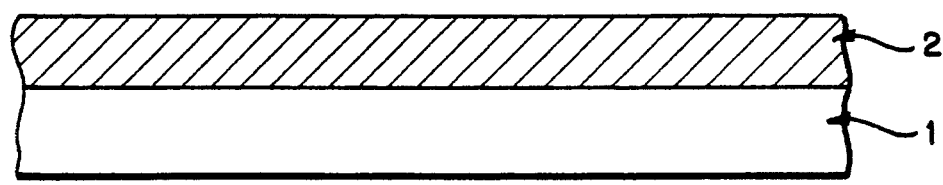
FIGS. 7a, b and c are views showing Embodiment 2 of a filer construction process according to the present invention.
Figure 7B:
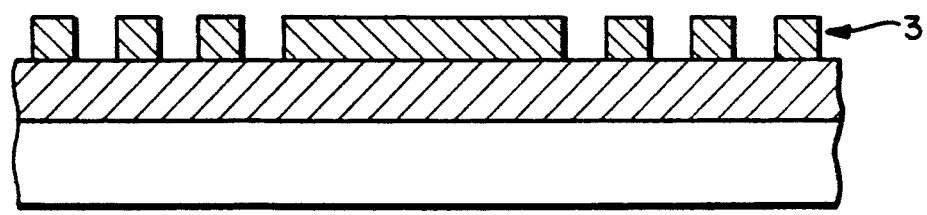

Embodiment 2 of the present invention relates to a method for manufacturing the filter described in Embodiment 1. It will be detailed in conjunction with FIGS. 7a-7b. On a substrate pervious to a visible light or a ultraviolet light, for example a quartz substrate 1 is formed a thin film 2 formed of material screening such visible light and a ultraviolet light, for example metal chromium (see FIGS. 7a-7b). Further on the thin film 2 is applied a resist for drawing patterns with electron beams, which is followed by drawing patterns by the conventional procedure and developing the resist to provide a desired resist pattern 3. The pattern at this point is such that the central part having diameter Ra1 shown in FIGS. 8a–8d is entirely coated with a resist. In the range of the diameter Ra1 to the diameter Ra2, a lattice-like pattern as shown in FIG. 8 (a) or a line and space pattern as shown in FIG. 8 (b) is formed to provide a desired transmittance rate as shown in Tables. 2-1 and 2-2.

TABLE 2-1

Line/space ratio in lattice-like pattern and transmittance rate

| line/space ratio | transmittance ratio (%) |
|---|---|
| 0.4/1 | 51 |
| 0.7/1 | 35 |
| 1/1 | 25 |
| 2/1 | 11 |

TABLE 2-2

Line/space ratio in lattice-like pattern and transmittance rate

| line/space ratio | transmittance rate (%) |
|---|---|
| 1/1 | 50 |
| 2/1 | 33 |
| 3/1 | 25 |
| 4/1 | 20 |
| 5/1 | 17 |
| 9/1 | 10 |

Figure 7C:
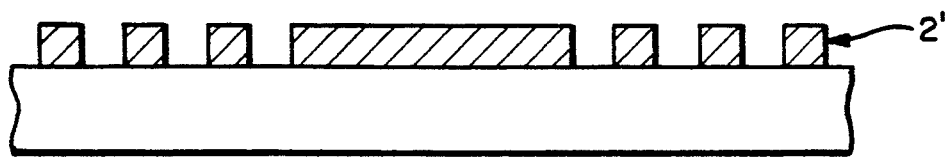
Figure 8A:
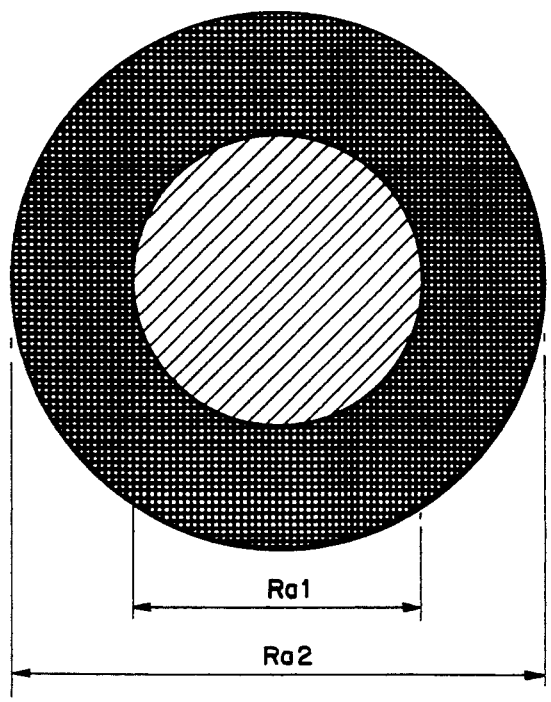
FIGS. 8a and b are views showing Embodiment 2 of the filter construction process.
Figure 8B:
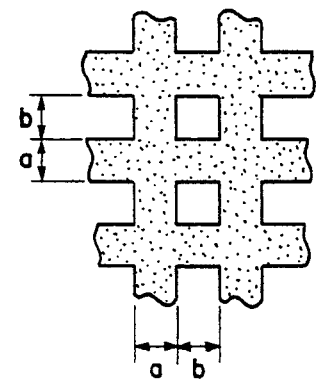
Figure 8C:
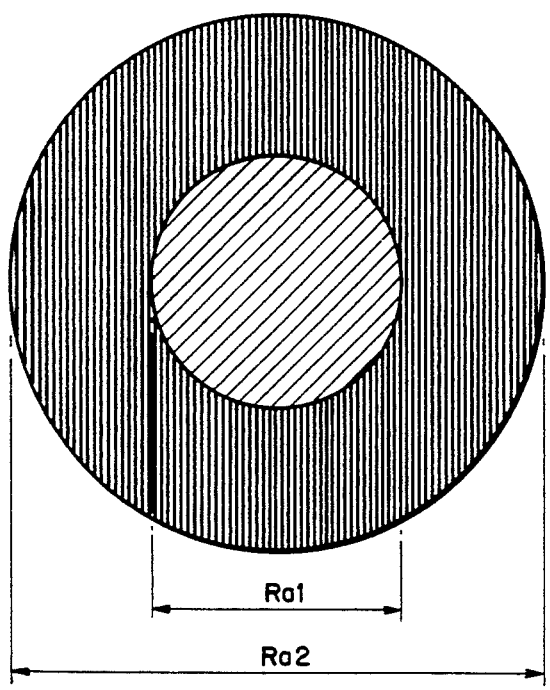
Figure 8D:
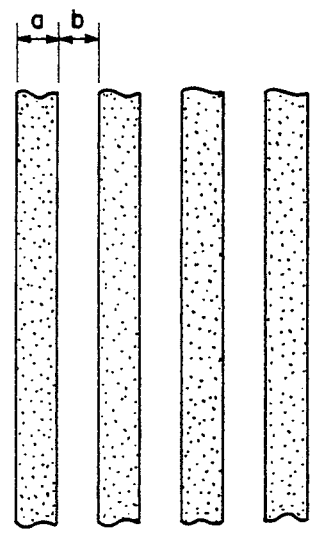

The resist pattern 3 thus obtained (see FIG. 7b) is used as a mask to etch the metal chromium thin film by the conventional procedure to separate the resist thereby completing the manufacture of the filter (see FIG. 7c). These individual process technique is already known in the art. Besides, the light-screening material is not restricted to metal chromium. It is also possible to use metals such as tungsten and tantalum or metal silicon compounds like MoSi and WSi that can be favorably formed on the quartz substrate.

Figure 9A:
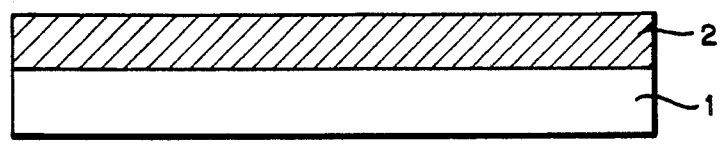
FIGS. 9a, b, c, d, e and f are views showing Embodiment 2 of the filter construction process.
Figure 9B:
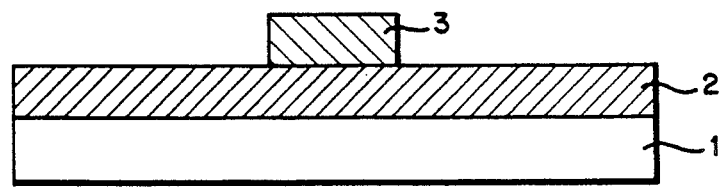
Figure 9C:
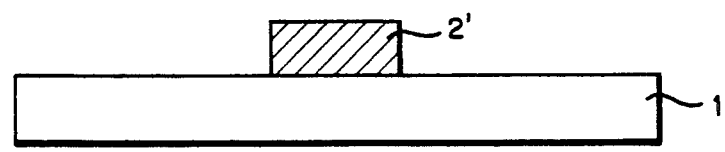
Figure 9D:
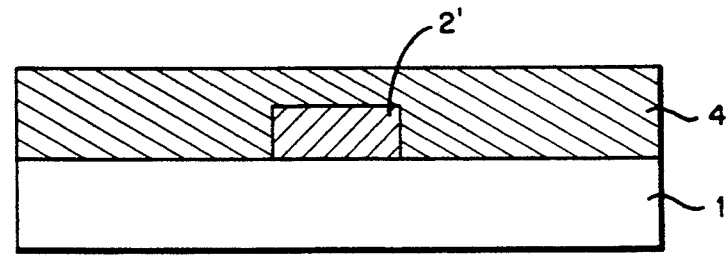
Figure 9E:
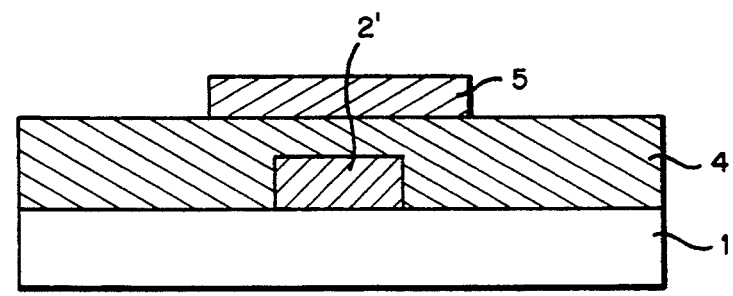
Figure 9F:
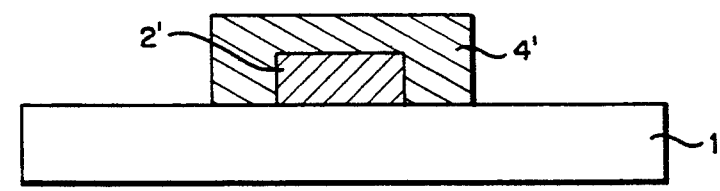
Figure 10:
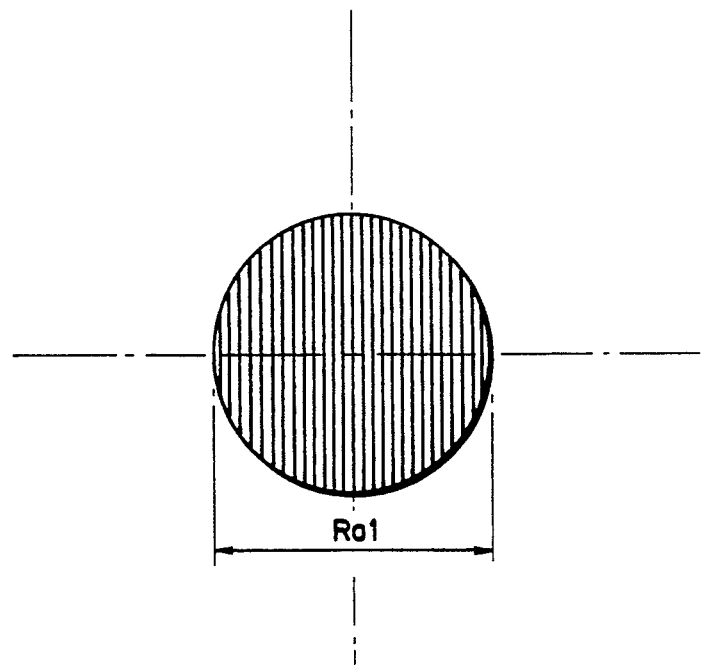
FIG. 10 is a view showing Embodiment 2 of the filter construction process.
Figure 11:
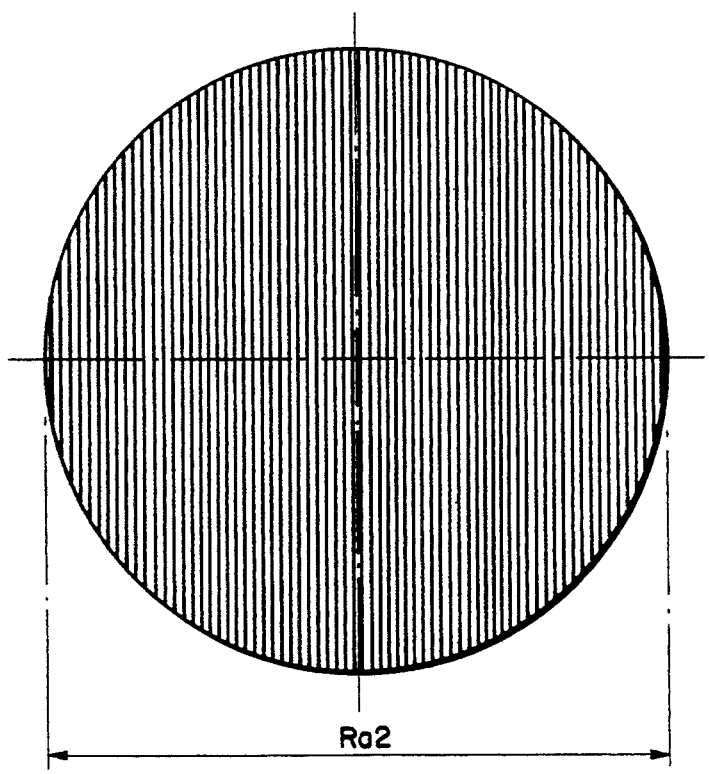
FIG. 11 is a view showing Embodiment 2 of the filter construction process.

Incidentally, in Embodiment 2, a method for setting the transmittance rate involves processing the light-screening film into a lattice-like or a line-and-space like configuration. However, it is possible to use the translucent film as mentioned hereinbelow. The method involving the use of the translucent film will be detailed in conjunction with FIGS. 9a–9f. On a substrate pervious to a visible light or a ultraviolet light used as a light source of the photolithographic system, for example, on a quartz substrate is formed a thin film formed of light-screening material, for example a metal chromium thin film 2 (see FIG. 9a). Furthermore, on the thin film 2 is applied a resist for drawing patterns with electron beams followed by drawing patterns with a conventional method to provide a desired resist pattern 3 (see FIG. 9b). In this case is formed a circular pattern having a transmittance rate of 0% centering on an optical axis of the diameter Ra1 as shown in FIG. 10. The resist pattern 3 thus formed is used as a mask to etch the metal chromium thin film 2 by the conventional procedure to provide a pattern 2' (see FIG. 9c). After separating the resist, a material 4 having a transmittance rate of 10% with respect to the wavelength of the photolithographic light (the transmittance rate can be voluntarily changed by changing the quality and the concentration of the pigment by using material having pigment mixed with a spin-on glass) is applied (see FIG. 9d). Further on the material 4 is applied a resist for drawing patterns with electron beams. After the patterns are drawn by the conventional procedure, the resist is developed and a desired resist pattern is obtained (see FIG. 9e). A circular pattern is formed with a transmittance rate of 10% centering on the optical axis of diameter Ra2 as shown in FIG. 11. The resist pattern thus formed is used as a mask to etch the translucent film 4 with a reactive ion etching (RIE) process to provide a pattern 4'. After separating the resist, a desired filter is obtained (see FIG. 9f). These individual process technique is known in the IC manufacturing process.

Figure 12A:
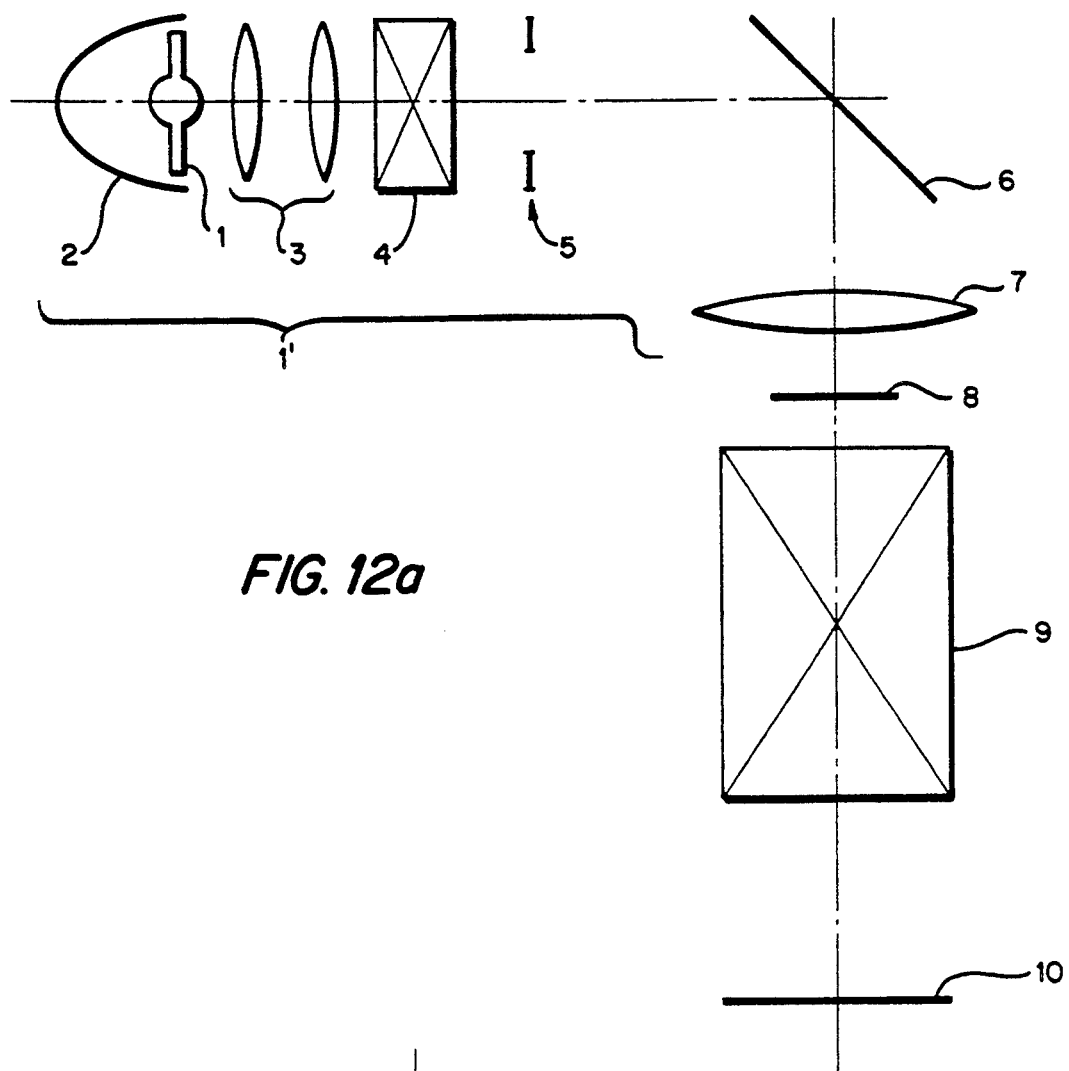
FIGS. 12a–12b are is a view illustrating the general construction of a conventional projection photolithographic system.
Figure 12B:
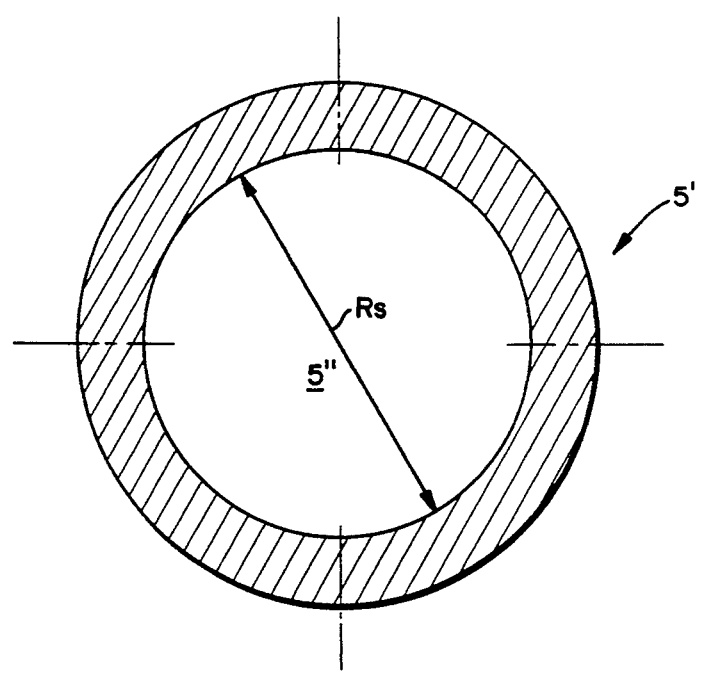

FIG. 13 shows a comparison between the filter of the present invention and the conventional filter C shown in FIG. 12 in term of the DOF. It becomes apparent that DOF (width) of the filter of the present invention enlarges.

Figure 14:
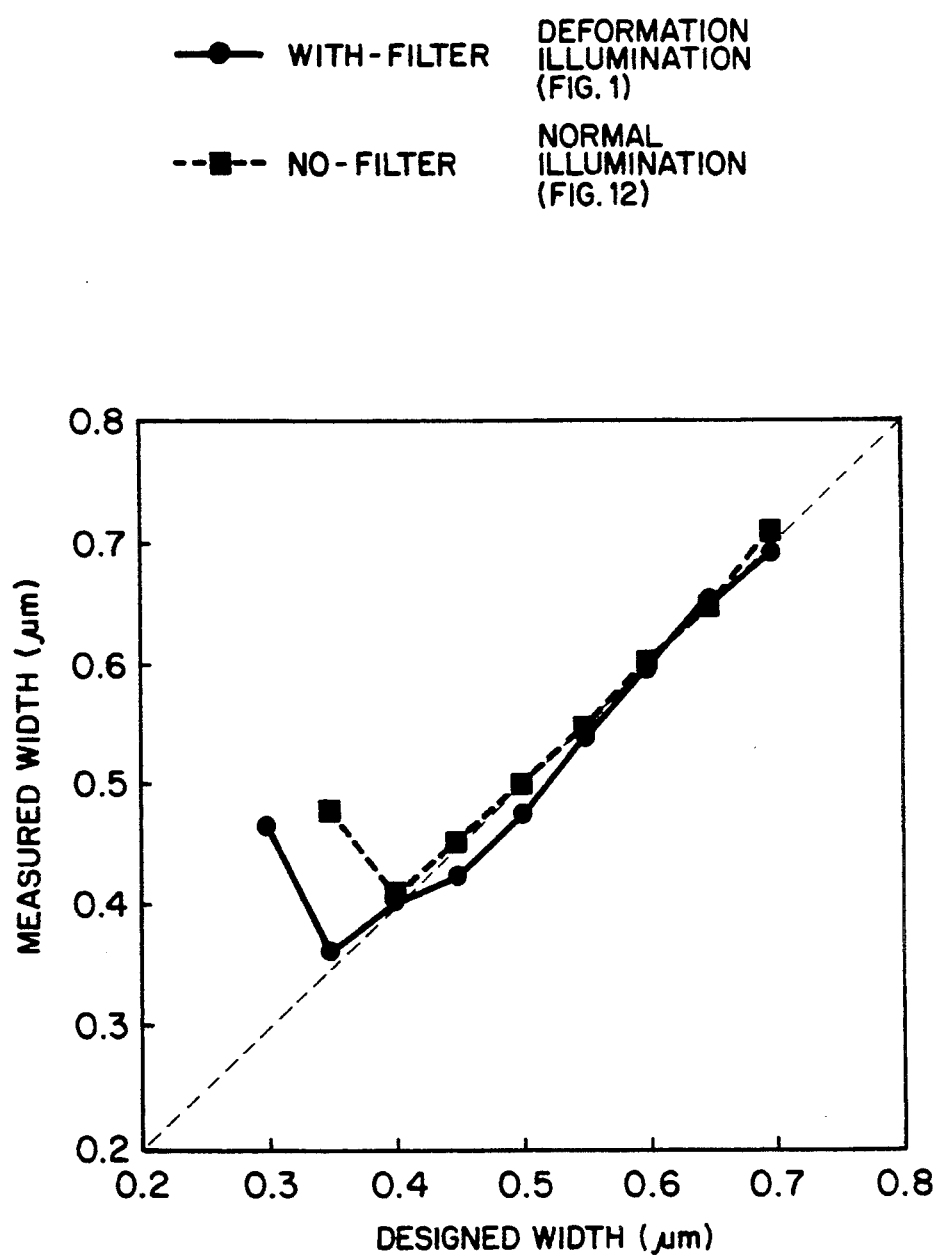
FIG. 14 is a graph showing an improvement in the resolution of the filter in Embodiment 2.
Figure 15D:
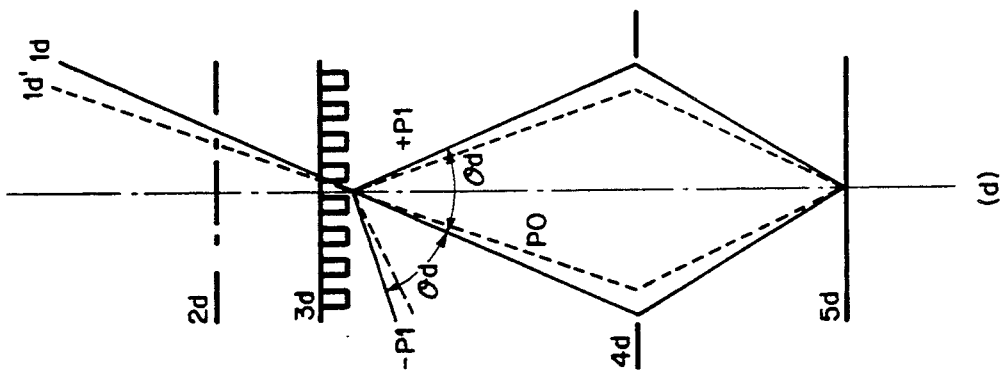
FIGS. 15a, b, c, and d are views illustrating a simple principle of the present invention.
Figure 15C:
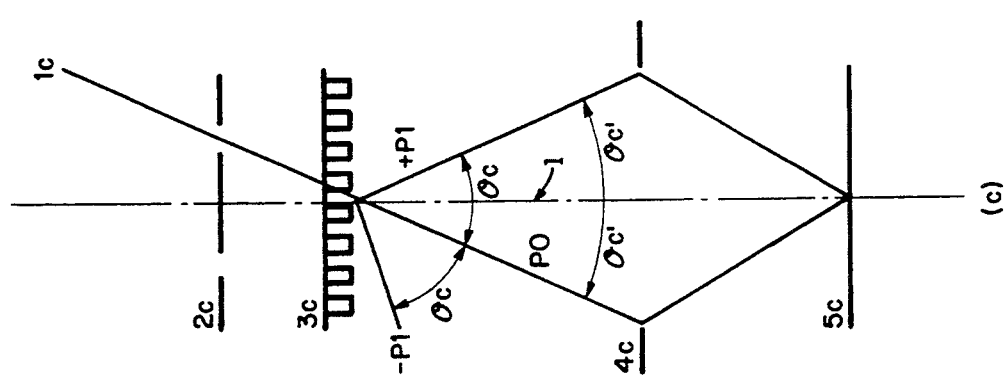
Figure 15B:
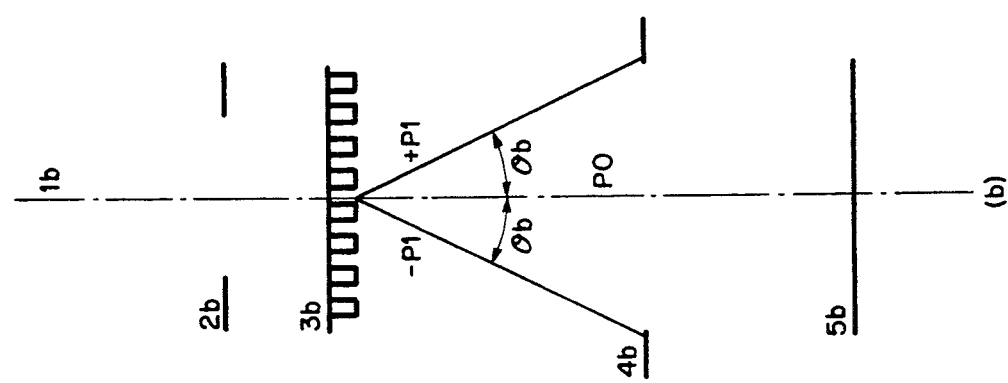
Figure 15A:
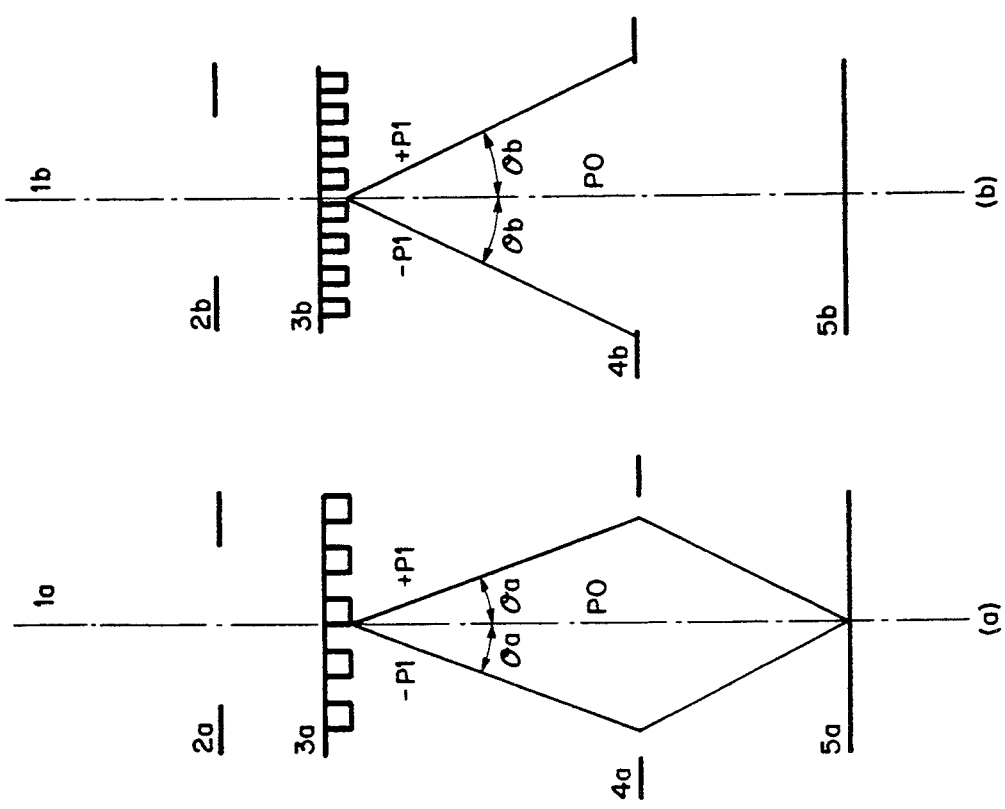

In addition, FIG. 14 shows a comparison between the two filters in terms of the resolution. It becomes apparent that the present invention improves the resolution.

Embodiment 3

Figure 16A:
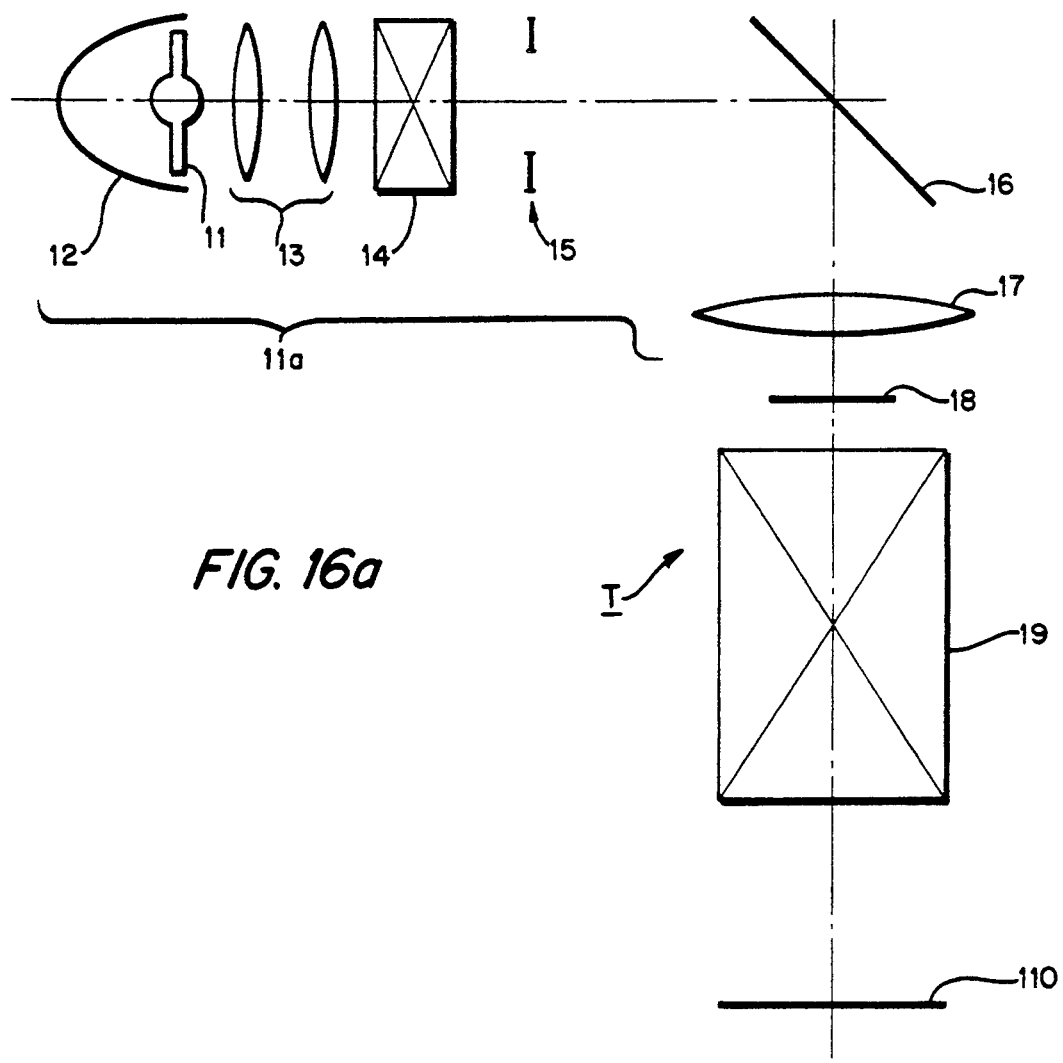
FIGS. 16a–16b are views illustrating the general construction of Embodiment 3 of projection photolithographic system according to the present invention.
Figure 16B:
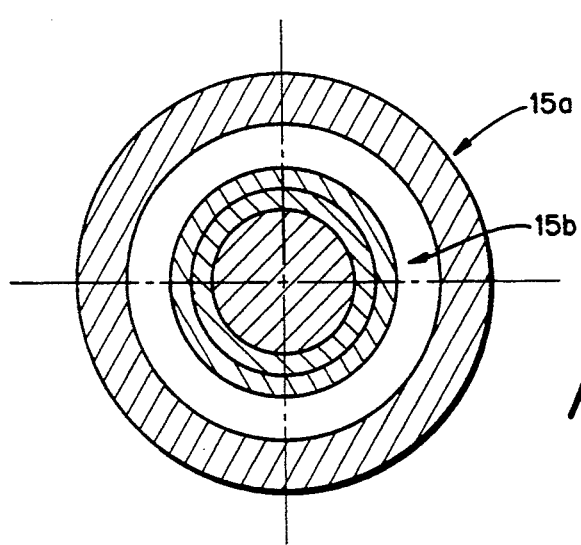
Figure 17A:
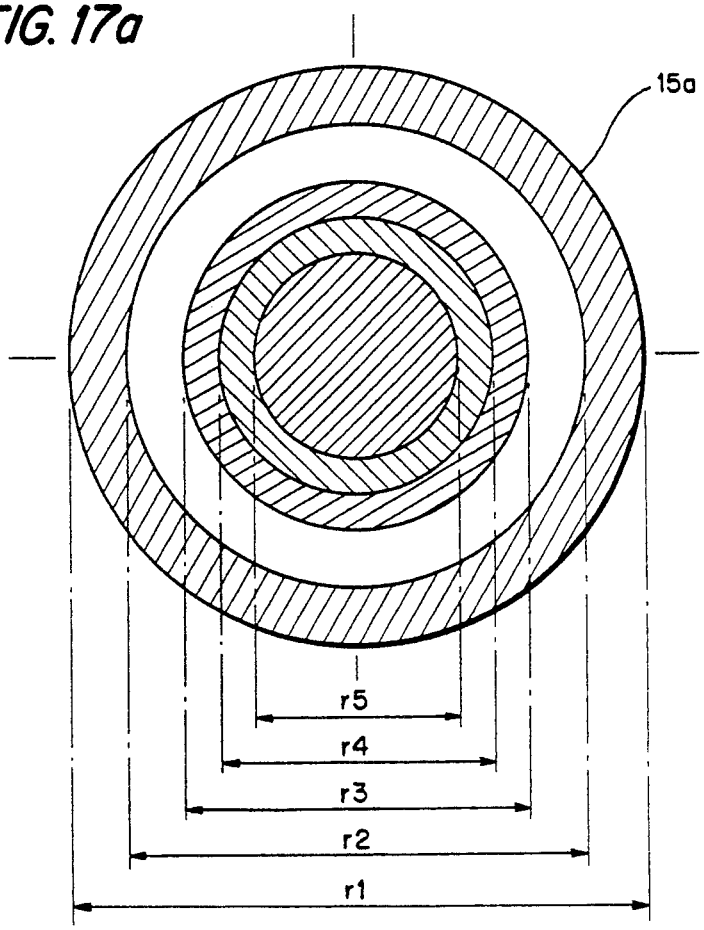
FIGS. 17a–17b are views illustrating the construction of the aperture (filter) of FIG. 16.
Figure 17B:
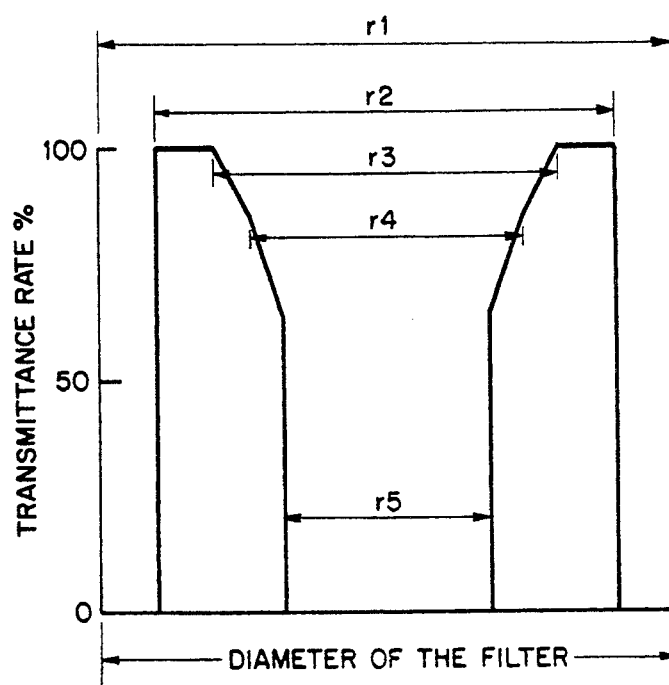

Embodiment 3 of the present invention will be detailed by way of FIGS. 16a–16b. FIGS. 17a–17b is a general view of the projection photolithographic system (T) of the present invention. The construction of the system is almost equal to the conventional projection photolithographic system. Reference Numeral 11 designates a Hg lamp used as a light source of the system, By providing a parallel light by an oblong mirror 12, a lens system 13 and further a fly's-eye lens, the light is focused into a certain area with an aperture 15 (designated by 15a in the front view) having a varied transmittance rate. Further, light reflected at a reflection mirror 16 passes through an illumination lens 17 to illuminate a photolithographic mask 18. Patterns formed on the photolithographic mask 18 is demagnified to one fifth of the original with a projection lens 19 to be transcribed on the semiconductor substrate 110.

Changing the transmittance rate with the aperture 15 by setting r1 to 90 mm, r2 to 80 mm, r3 to 70 mm, r4 to 68 mm and r5 to 66 mm allows only 0th-order diffracted light and either of the ±1st-order diffracted light to form an image. Thus the resolution is improved. Thus a simple change of the transmittance rate of the aperture 15 (referred to as a deformation filter) largely improves the contrast of the transcription pattern on the substrate.

Figure 18:
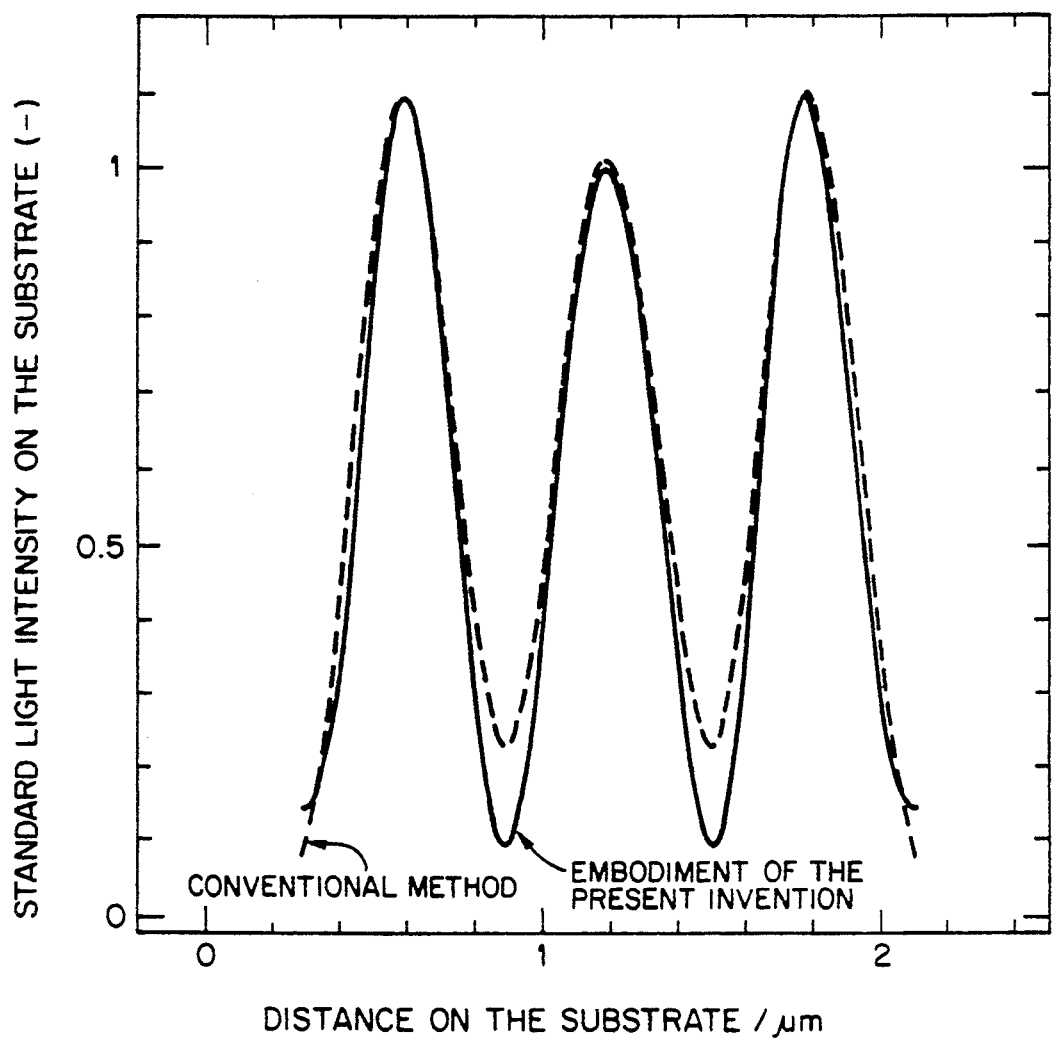
FIG. 18 is a view showing the result of the simulated result of the effect of the conventional projection photolithographic system and that of Embodiment 3 according to the present invention.

A simulation confirms that the contrast has improved compared with the conventional mask as shown in FIG. 18.

A photolithographic test was performed by using an i-line stepper having the above aperture and an NA of 0.45. Conventionally the upper limit of the resolution was a line and space of 0.4 $\mu$m. Use of the aperture enables a resolution of 0.32 $\mu$m line and space. Thus it was confirmed that the resolution has improved by more than 20%.

As a deformation aperture in Embodiment 3, the measurements of r1, r2, r3 and r4 are not limited as shown in FIGS. 17a–17b. Any measurement will do as long as the transmittance rate in the central part assumes 0% and the transmittance rate in the periphery assumes 100%.

Figure 19A:
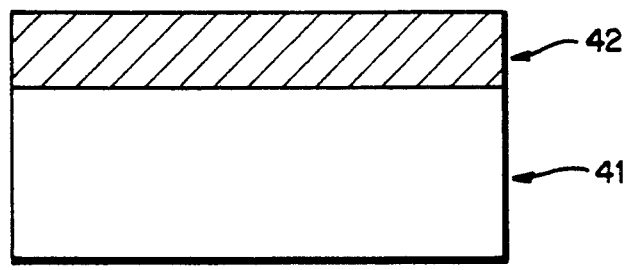
FIGS. 19a, b and c are views illustrating the process for preparing the aperture of FIG. 2.
Figure 19B:
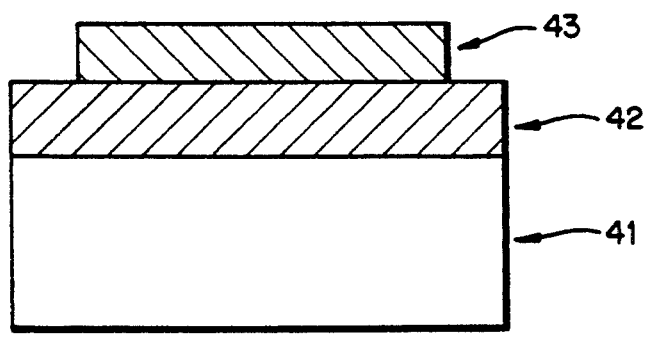
Figure 19C:
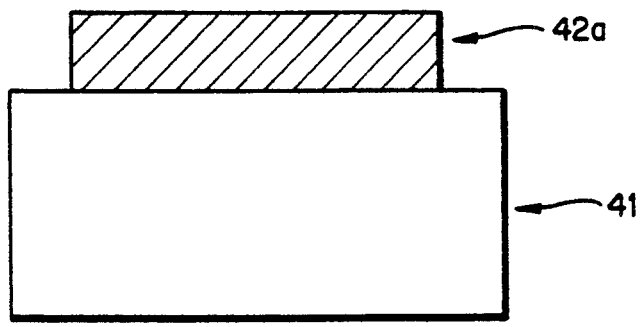

In the foregoing passage, an embodiment of a method for manufacturing a deformation aperture described in Embodiment 3 will be detailed hereinbelow by way of FIGS. 19a–19c. On a substrate pervious to a visible light or a ultraviolet light used as a light source of the photolithographic system, for example a quartz substrate 41, a thin film formed of a material screening the visible light or the ultraviolet light, for example metal chromium is formed (see A in FIGS. 19a–19c). Furthermore, a resist is applied for drawing patterns with electron beams. After drawing patterns by the conventional procedure, the resist is developed to provide a desired resist pattern 43 (see B in FIGS. 19a–19c). The resist pattern 43 is used as a mask to etch the metal chromium thin film 42 by the conventional procedure to provide a pattern 42a thereby completing the manufacture of a deformation aperture (see FIGS. 16a–16b and 15 in FIGS. 17a–17b) (see c in FIGS. 19a–19c). These individual processing technique are known art in the process for manufacturing IC's. In addition, as a material that can screen light is not limited to metal chromium, but such metals as tungsten and tantalum as well as metal silicon compounds such as MoSi and WSi can be used which can be favorably formed on the quartz substrate.

Embodiment 4

Figure 20:
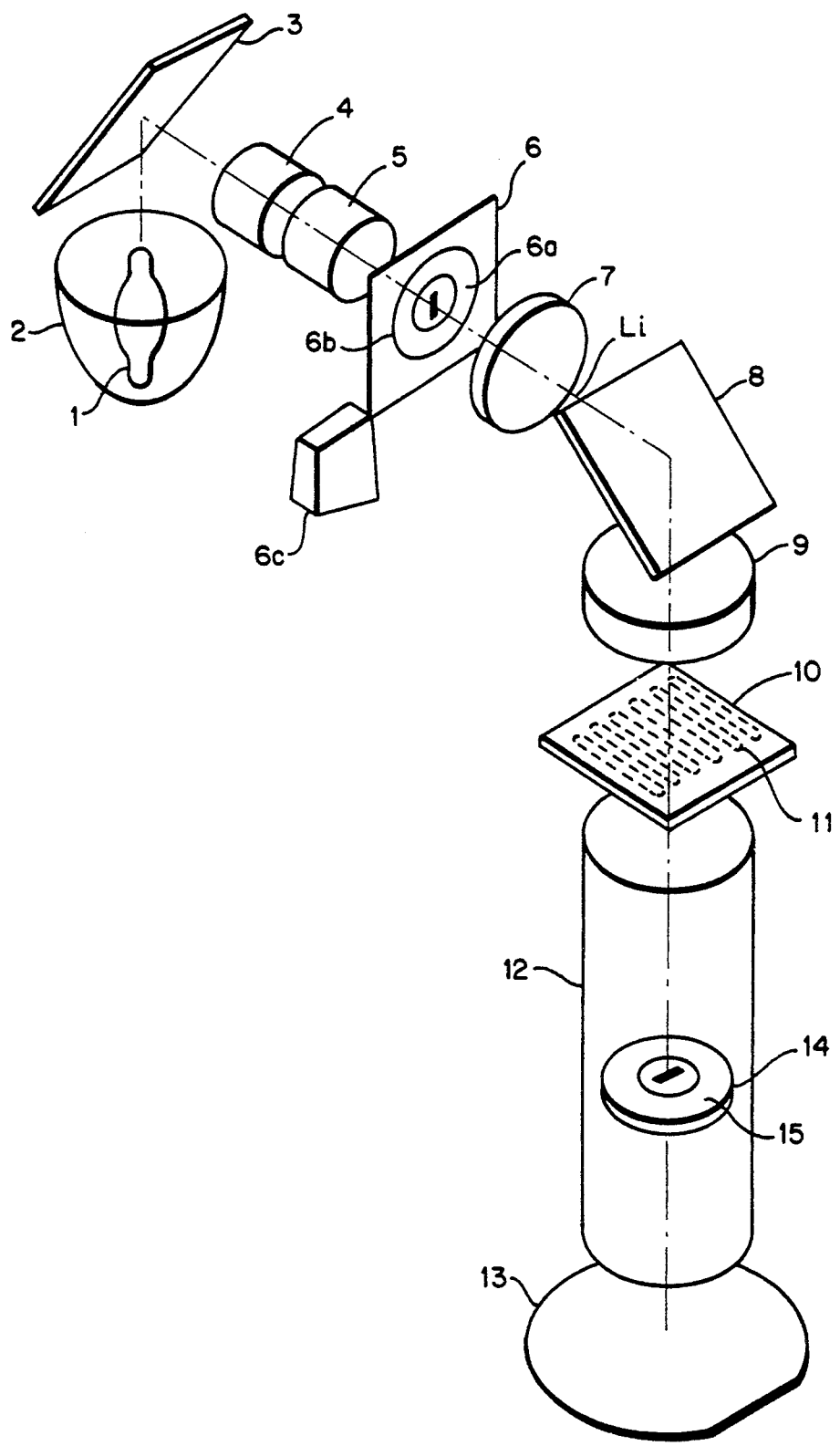
FIG. 20 is a view showing the general construction of Embodiment 4 of demagnified projection photolithographic system.

Embodiment 4 of the present invention will be detailed by way of FIG. 20. FIG. 20 is a general view of a demagnified projection photolithographic system. A photolithographic light emitted from a Hg lamp used as a light source illuminates a mask 10 through an oblong mirror 2, a cold mirror 3, a converging optical element 4, a fly's-eye lens, a deformation aperture 6, a relay lens 7, a mirror 8 and a condenser lens 9. The photolithographic light modulated with a pattern 11 on the mask 10 is transcribed by a projection lens 12 on a sample substrate 13 demagnified to one fifth. The deformation aperture 6 is provided on a position cooperating with the pupil of the illumination optical device.

Each size of deformation apertures in accordance with the present invention will be determined in the following way. The r1 is determined by the size of the illumination optical system as a whole, but preferably the size is larger by about 10 mm than the fly's eye lens on practical terms. The r2 is determined by $\sigma$ designating the ration of NA of the projection lens to NA of the illumination condenser lens. The r3 is determined by the following equation;

r3=2×f×λ/(2×P) where f represents the focal length of the illumination condenser lens, λ a wavelength of photolithographic light, P a pitch of the minimum pattern.

r4=f1×r3 where f represents a filter voluntarily determined by a layer which requires a transcription pattern. Any value ranging between 0.1 and 0.9 can be selected. For example, in layers where resolution and the DOF are considered as being important the value is set to 0.7 through 0.9. In layers where a throughput is considered as being important the value is preferably set to about 0.1 to 0.5.

Figure 22A:
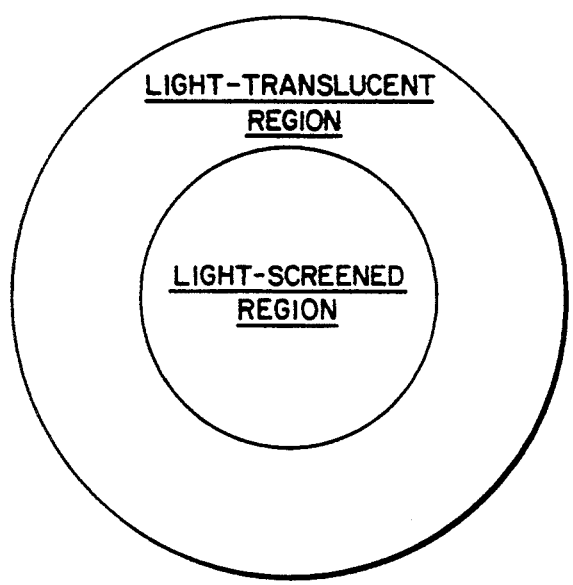
Figure 22B:
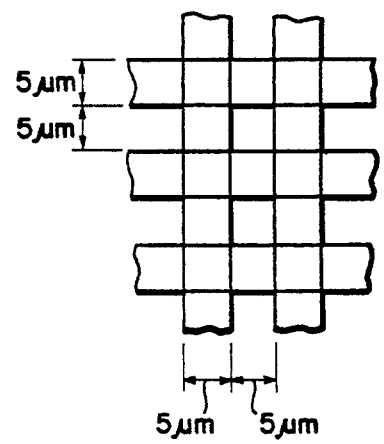
Figure 23A:
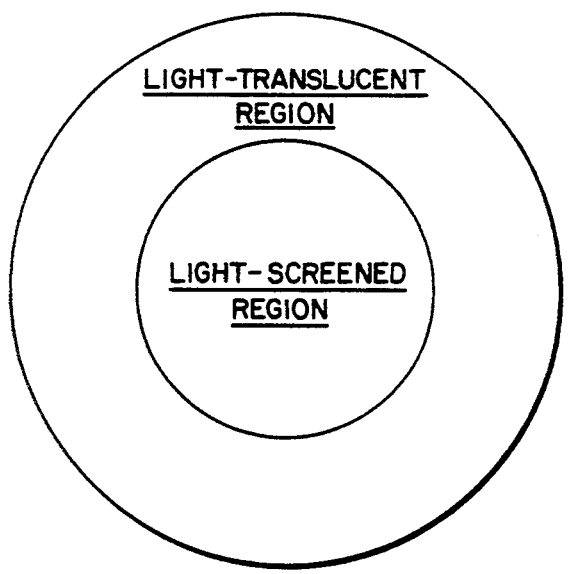
FIGS. 23a–23b are plane views showing a configuration of a line and space translucent region in Embodiment.
Figure 23B:
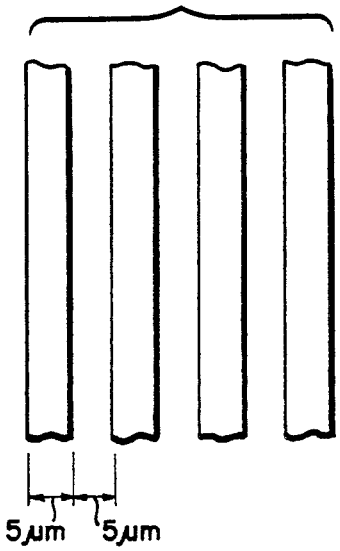

In Embodiment 4, i-line (having a wavelength of 365 nm) is adopted as a photolithographic light for the deformation aperture 6 as shown in a plane view of FIGS. 21a–21b. A illumination condenser lens has a focal length of 175 nm. The pitch of the pattern on the mask is set to 0.64 μm. The r3 is set to 50 mm whereas r4 is set to 35 mm by adopting 0.7 for f1. Incidentally, r1 assumes 90 m and r2 80 mm. In addition, on the translucent part a lattice-like translucent region having a pattern size of 5 μm and a duty ratio of 0.5 is provided as shown in a plane view of FIGS. 22a–22b. Incidentally, it is possible to form the light-pervious region into a line and pace configuration shown in FIGS. 23a–23b. Producing the same effect as the lattice-like pattern requires an adjustment of the duty ratio to equalize the area ratio between the light-pervious part and the light-screening part with the case of the lattice-like pattern. The qualitative values representing these contents are described in Table 2-1 and Table 2-2 in Embodiment 2. When A designate the whole area of the translucent part and a pattern size, the ratio of the whole area of the light-pervious part in the lattice-like pattern as opposed to the whole area of the light-pervious part in the line and space configuration can be approximately represented by a formula;

a2A/4:aA/2 on which the line and space configuration can be prepared.

Figure 24A:
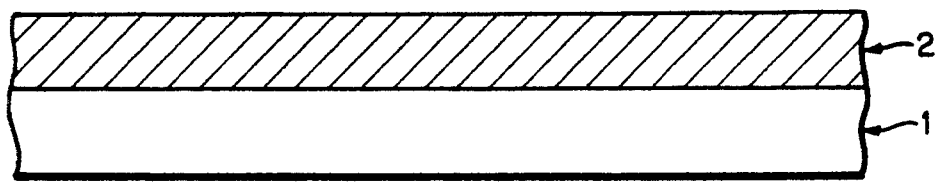
FIGS. 24a, b and c are graphs showing a process for preparing the deformation aperture.
Figure 24B:
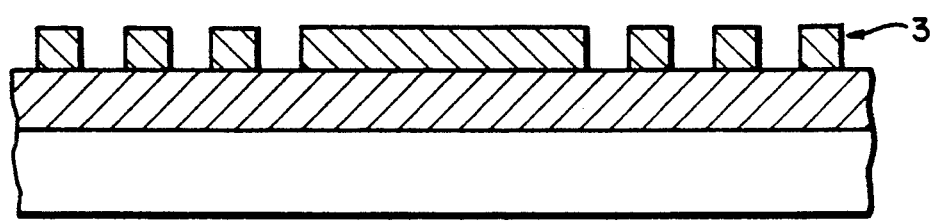
Figure 24C:
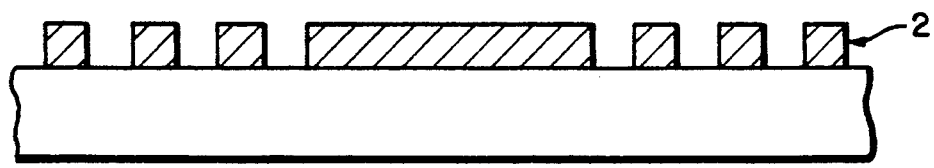

The deformation aperture 6 can be manufactured in the following way. FIGS. 24a–24c are views illustrating the process for manufacturing the deformation aperture 6.

On a quartz substrate pervious to a visible light or a ultraviolet light used as a light source of a projection photolithographic device is formed a metal chromium thin film 2 used as a material screening such visible and ultraviolet lights (see FIG. 24a). Further on the metal chromium thin film 2 is applied a resist for drawing patterns with electron beams. After drawing patterns with electron beams by the conventional procedure, the resist is developed to provide a desired resist pattern 3 (see FIG. 24b). The metal chromium thin film 2 is etched by the conventional procedure with the resist pattern used as a mask 3 to give a pattern 2′ thereby completing the manufacture of the deformation aperture (see FIG. 24c). Incidentally as the light-screening material, metals like tungsten and tantalum that can be favorably formed on the quartz substrate or metal silicon compounds like MoSi and WSi can be used.

A desired deformation aperture can be obtained by directly processing metal plates with a laser processing device or the like.

Furthermore, a liquid crystal device and electrochromic device can be used for the deformation aperture though Embodiment 4 uses a metal plate for the deformation aperture. When the liquid crystal device or the electrochromic device are used, the size and the configuration of the light-pervious part in the deformation aperture can be accurately and quickly changed.

A photolithographic test was performed using a conventional i-line stepper with NA of 0.45 wherein the above deformation aperture was mounted on a position cooperating with the pupil of an illumination optical device as shown in FIG. 20. Although the conventional stepper (the configuration of the aperture thereof is shown by 5′ in FIGS. 12a–12b) was only capable of resoluting 0.4 μm line and space as the upper limit, the i-line stepper adopting the above deformation aperture could resolute 0.32 μm line and space, thereby confirming that the resolution was improved by more than 20%. When comparing the i-line stepper having the above deformation aperture mounted with a stepper using an annular illumination aperture having r3 of 50 mm, the resolution and the DOF was not lowered and the throughput was improved by about 20%.

Figure 25:
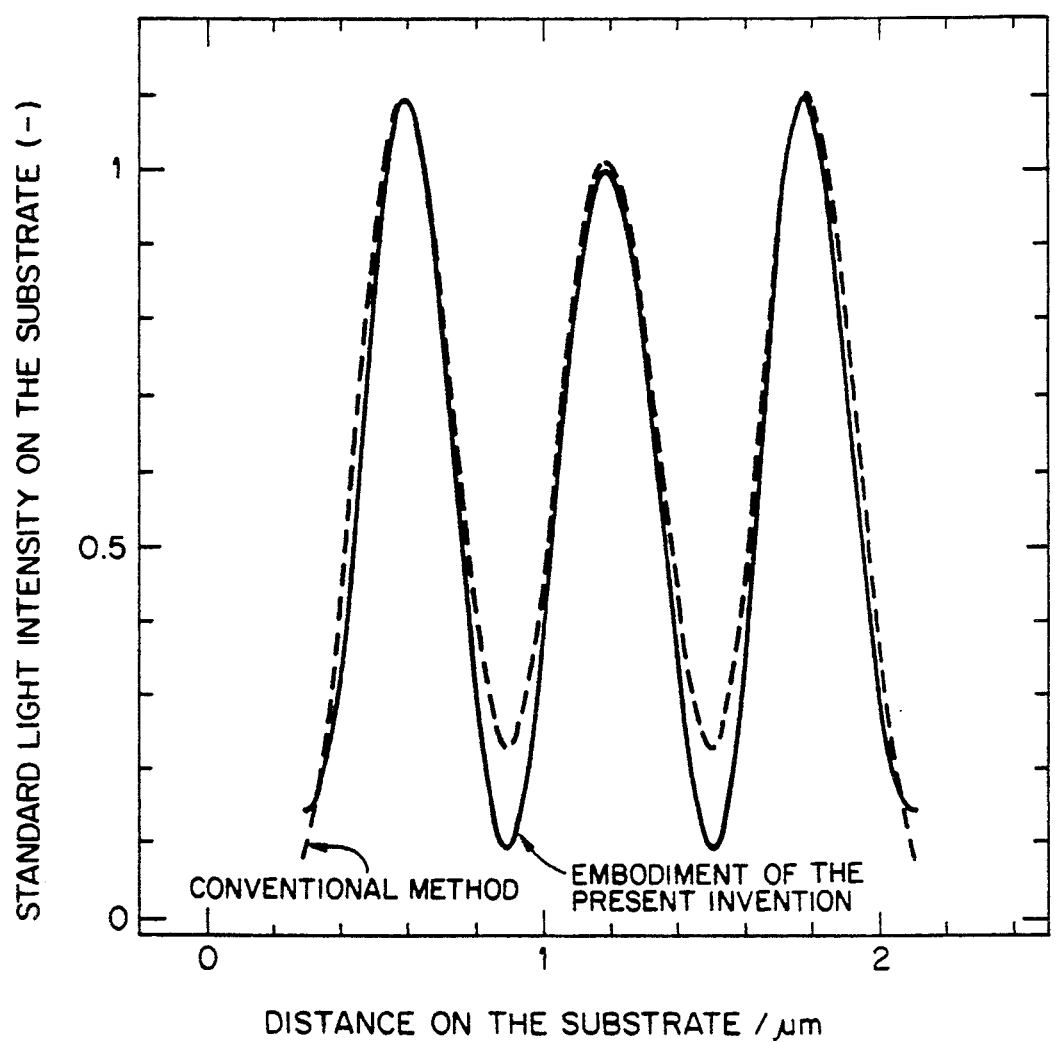
FIG. 25 is a graph showing the simulated result of the effect of Embodiment 4.

The above deformation aperture 6 was mounted at least one of the following position, generally on the pupil of the illumination optical device, generally on a position cooperating with the pupil thereof, and generally on the pupil of the projection optical device. The effect was confirmed by performing a simulation in a case where the wavelength of the photolithographic light is set to 365 nm and the pitch of the pattern is set to 0.6 μm. The simulation shows that a contrast on the wafer was improved compared with the conventional met method as shown in FIG. 25.

Incidentally, a configuration of the deformation aperture is determined in accordance with a transcription pattern and a wavelength of a photolithographic light used in each case. Based on them a size of a lattice or a line and space, a duty ratio or a diameter of the light-pervious part are also selected.

As described above, the present invention forms in a projection photolithographic system not only one circular light-impervious part screening substantially to 0% level the 0th-order diffracted light of a pattern to be projected to the substrate but also a ring-like translucent part concentrically contacting the periphery of the light-impervious part to raise the substantial transmittance rate of part of the 0th-order diffracted light and +1st or the −1st-order diffracted light at the pupil of the projection lens. Thus the present invention provides such projection photolithographic system capable of adjusting a contradictory requirements of screening the 0th-order diffracted light incident on the pupil of the projection lens and securing a sufficient energy of a photolithographic light to improve the resolution of the projection photolithographic system quite easily without deteriorating the DOF.

The present invention thus being described, it will be obvious that the same may be valid in many ways. Such variation are not to be regarded as a departure from the spirit and scope of the invention, and all such modification as would be obvious to those skilled in the art are intended to be included within the scope of the following claims.

What is claimed is:

1. A filter for use in a projection photolithographic system comprising:
    a circular light-impervious part for screening substantially 100% on the pupil of a projection lens the 0th-order diffracted light of a pattern to be projected on a substrate of the projection photolithographic system;
    a ring-like translucent part concentrically contacting the periphery of the circular light-impervious part to transmit on the pupil of the projection lens part of the 0th-order diffracted light and the +1st- or the −1st-order diffracted light of the pattern to be projected on the substrate; and
    a ring-like light-pervious part concentrically contacting the periphery of the ring-like translucent part to transmit substantially 100% on the pupil of the projection lens the +1st- or the −1st-order diffracted light of the pattern to be projected on the substrate.

2. A filter according to claim 1 wherein the ring-like translucent part exhibits at the pupil a 5 to 30% transmittance in sum total of diffracted light such as part of the 0th-order diffraction light and the +1st- or the −1st-order diffracted light of the pattern to be projected on the substrate.

3. A filter according to claim 1 wherein the outer diameter of the circular light-impervious part is 0.05 to 0.50 of the outer diameter of the ring-like light-pervious part whereas the outer diameter of the ring-like translucent part is 0.65 to 0.75 of the outer diameter of the ring-like light-pervious part.

4. A filter according to claim 3 wherein the outer diameter of the circular light-impervious part is 0.10 to 0.20 of the outer diameter of the ring-like light-pervious part.

5. A filter according to claim 1 wherein the ring-like translucent part exhibits on the pupil of the projection lens the sum total of transmittance rate of diffracted light such as part of the 0th-order diffracted light and the +1st- or −1st-order diffracted light which sum is either approximately uniform as a whole, stepwise large in the centrifugal direction as viewed from the center of the circular light-impervious part or gradually large in the centrifugal direction as viewed from the center of the circular light-impervious part.

6. A filer according to claim 5 wherein the ring-like translucent part comprises a group of light-impervious fine lines comprising a plurality of fine line concretely formed with an equal width or in an equally spaced manner and a group of light-pervious fine lines formed between each of the light-impervious fine lines, the light-impervious fine lines screening substantially to 0% level the 0th-order diffracted light and the +1st- or the −1st-order diffracted light, the light-pervious fine lines transmitting substantially 100% on the pupil of the projection lens the 0th-order diffraction light and the +1st or −1st-order diffracted light.

7. A filter according to claim 5 wherein the ring-like translucent part comprises a group of light-impervious fine lines formed by intersecting a plurality of equally spaced fine lines with equal width and a group of light-pervious dots formed between each light-impervious fine lines, the light-impervious fine lines screening substantially to 0% level the 0th-order diffracted light and the +1st- or the −1st-order diffracted light, the light-pervious fine dots transmitting substantially 100% on the pupil of the projection lens the 0th-order diffraction light and the +1st- or the −1st-order diffracted light.

8. A filter according to claim 5 wherein the ring-like translucent part comprises a first ring-like translucent portion concentrically contacting the periphery of the circular light-impervious part and a second ring-like translucent portion concentrically contacting the periphery of the first translucent portion, the first ring-like translucent portion setting to 5% or more on the pupil of the projection lens the transmittance rate of the diffracted light such as part of the 0th-order diffracted light and the +1st- or the −1st-order diffracted light of the pattern to be projected on the substrate, the second translucent portion setting to more than the counterpart of the first translucent portion but not more than 30% on the pupil of the projection lens the transmittance rate of the diffracted light such as part of the 0th-order diffracted light and the +1st- or the −1st-order diffraction light.

9. A filter according to claim 8 wherein the ring-like translucent part comprises a translucent film formed of spin-on glass to which pigment is mixed.

10. A projection photolithographic system comprising an illumination optical device for illuminating by using a visible or a ultraviolet light as a light source a mask on which fine patterns are formed wherein any filter of claim 1 is mounted at least one position out of generally the pupil of the illumination optical device and the portion cooperating with the pupil thereof.

11. A method for projecting a pattern onto the substrate comprising the steps of:
    mounting the filter described in claim 1 on at least one position out of the pupil of the illumination optical device or the portion cooperating the pupil thereof in a projection photolithographic system having such illumination optical system for illuminating by using a visible or a ultraviolet light as a light source a mask on which fine patterns are formed and a projection optical system for projecting fine patterns on the substrate; and projecting fine patterns formed on the mask by demagnifying them.

* * * * *